US012718734B2

(12) United States Patent
Dong et al.

(10) Patent No.: US 12,718,734 B2

(45) Date of Patent: Aug. 25, 2026

(54) DISPLAY DEVICE AND DRIVING METHOD THEREFOR, AND VEHICLE

(71) Applicants: Beijing BOE Display Technology Co., Ltd., Beijing (CN); BOE Technology Group Co., Ltd., Beijing (CN); Beijing BOE Technology Development Co., Ltd., Beijing (CN)

(72) Inventors: Xiaoqiao Dong, Beijing (CN); Rui Han, Beijing (CN); Jie Yu, Beijing (CN); Fengping Wang, Beijing (CN); Chunhua Wang, Beijing (CN); Xiaoxia Wang, Beijing (CN); Yang Wang, Beijing (CN); Daekeun Yoon, Beijing (CN); Qing Ma, Beijing (CN); Biqi Li, Beijing (CN); Tiantian Liu, Beijing (CN); Qi Fu, Beijing (CN); Qiannan Pan, Beijing (CN); Pengtao Li, Beijing (CN); Xiwang Xing, Beijing (CN); Chuanping Zhu, Beijing (CN); Zhipeng Zhang, Beijing (CN)

(73) Assignees: Beijing BOE Display Technology Co., Ltd., Beijing (CN); BOE Technology Group Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/996,032

(22) PCT Filed: Apr. 17, 2024

(86) PCT No.: PCT/CN2024/088445

§ 371 (c)(1),
(2) Date: Jan. 17, 2025

(87) PCT Pub. No.: WO2024/239856

PCT Pub. Date: Nov. 28, 2024

(65) Prior Publication Data

US 2026/0018101 A1 Jan. 15, 2026

(30) Foreign Application Priority Data

May 22, 2023 (CN) ......................... 202310582872.2

(51) Int. Cl.
*G09G 3/20* (2006.01)
*G06F 3/01* (2006.01)
(Continued)

(52) U.S. Cl.
CPC ......... *G09G 3/2092* (2013.01); *G06F 3/0412* (2013.01); *G06F 3/0416* (2013.01);
(Continued)

(58) Field of Classification Search
CPC ...... G09G 3/2092; G09G 3/32; G09G 3/3674; G09G 2310/0286; G09G 2320/0233;
(Continued)

(56) References Cited

U.S. PATENT DOCUMENTS

2016/0321984 A1* 11/2016 Kim ..................... G09G 3/2096
2020/0272009 A1* 8/2020 Nakagawa ........ G02F 1/134363
(Continued)

FOREIGN PATENT DOCUMENTS

CN 111586214 A 8/2020
CN 112992086 A 6/2021
CN 115657874 A 1/2023

*Primary Examiner* — Robin J Mishler
(74) *Attorney, Agent, or Firm* — WHDA, LLP

(57) ABSTRACT

An displaying device includes a backlight module, a display panel located on one side of the backlight module, at least two first driving-chip groups, at least two first circuit boards and a system chip, each of the first driving-chip groups includes at least two first driving chips, and all of the first driving chips are electrically connected to the display panel.
(Continued)

Each of the first circuit boards is electrically connected to one first driving-chip group, the first circuit boards are cascaded, and at least some of the signals transmitted in the first circuit boards are synchronous. The first circuit boards are electrically connected to the backlight module. The system chip is electrically connected to the first circuit boards, and configured for providing at least two channels of the same video signal to the at least two first circuit boards, and receiving a touch-controlling signal from the display panel.

19 Claims, 15 Drawing Sheets

(51) Int. Cl.

| | |
|---|---|
| ***G06F 3/041*** | (2006.01) |
| ***G06V 20/59*** | (2022.01) |
| ***G09G 3/32*** | (2016.01) |
| ***G09G 3/36*** | (2006.01) |
| ***H10H 29/24*** | (2026.01) |

(52) U.S. Cl.
CPC ............ *G09G 3/32* (2013.01); *G09G 3/3674* (2013.01); *H10H 29/24* (2025.01); *G06F 3/017* (2013.01); *G06V 20/597* (2022.01); *G09G 2310/0286* (2013.01); *G09G 2320/0233* (2013.01); *G09G 2320/0626* (2013.01); *G09G 2320/068* (2013.01); *G09G 2330/021* (2013.01); *G09G 2354/00* (2013.01); *G09G 2358/00* (2013.01); *G09G 2360/144* (2013.01); *G09G 2380/10* (2013.01)

(58) Field of Classification Search
CPC ..... G09G 2320/0626; G09G 2320/068; G09G 2330/021; G09G 2354/00; G09G 2358/00; G09G 2360/144; G09G 2380/10; G09G 3/34; G09G 3/36; H10H 29/24; G06F 3/0412; G06F 3/0416; G06F 3/01; G06F 3/017; G06F 3/041; G06F 3/147; G06V 20/59; G06V 20/597
See application file for complete search history.

(56) References Cited

U.S. PATENT DOCUMENTS

| | | | | |
|---|---|---|---|---|
| 2024/0071285 | A1* | 2/2024 | Hsieh | G09G 3/2096 |
| 2024/0321175 | A1* | 9/2024 | Kwon | G06F 3/0412 |
| 2025/0091441 | A1* | 3/2025 | Kim | G09G 3/3611 |

* cited by examiner

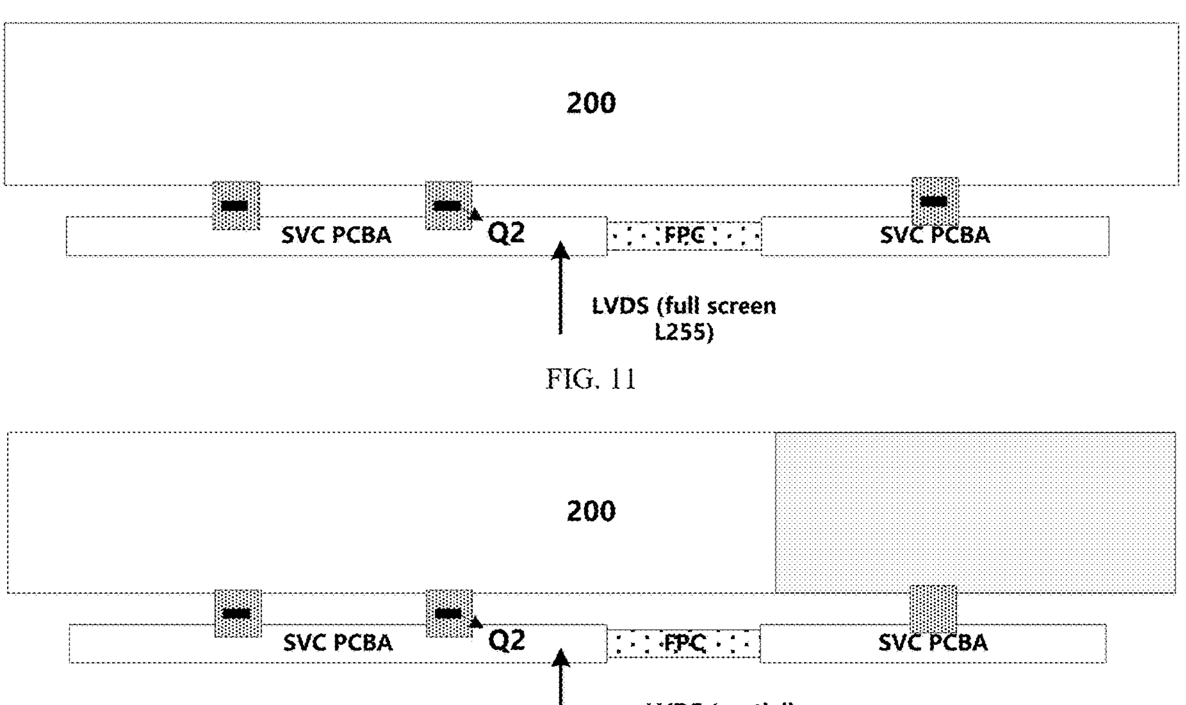
FIG. 11
FIG. 12
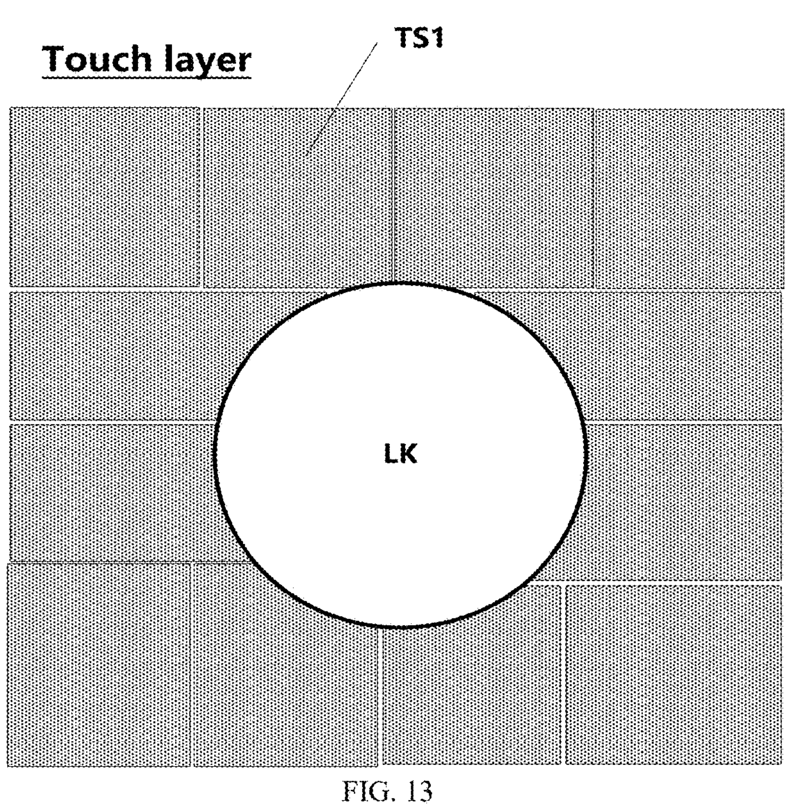
FIG. 13

EYE

0°

45°

45°

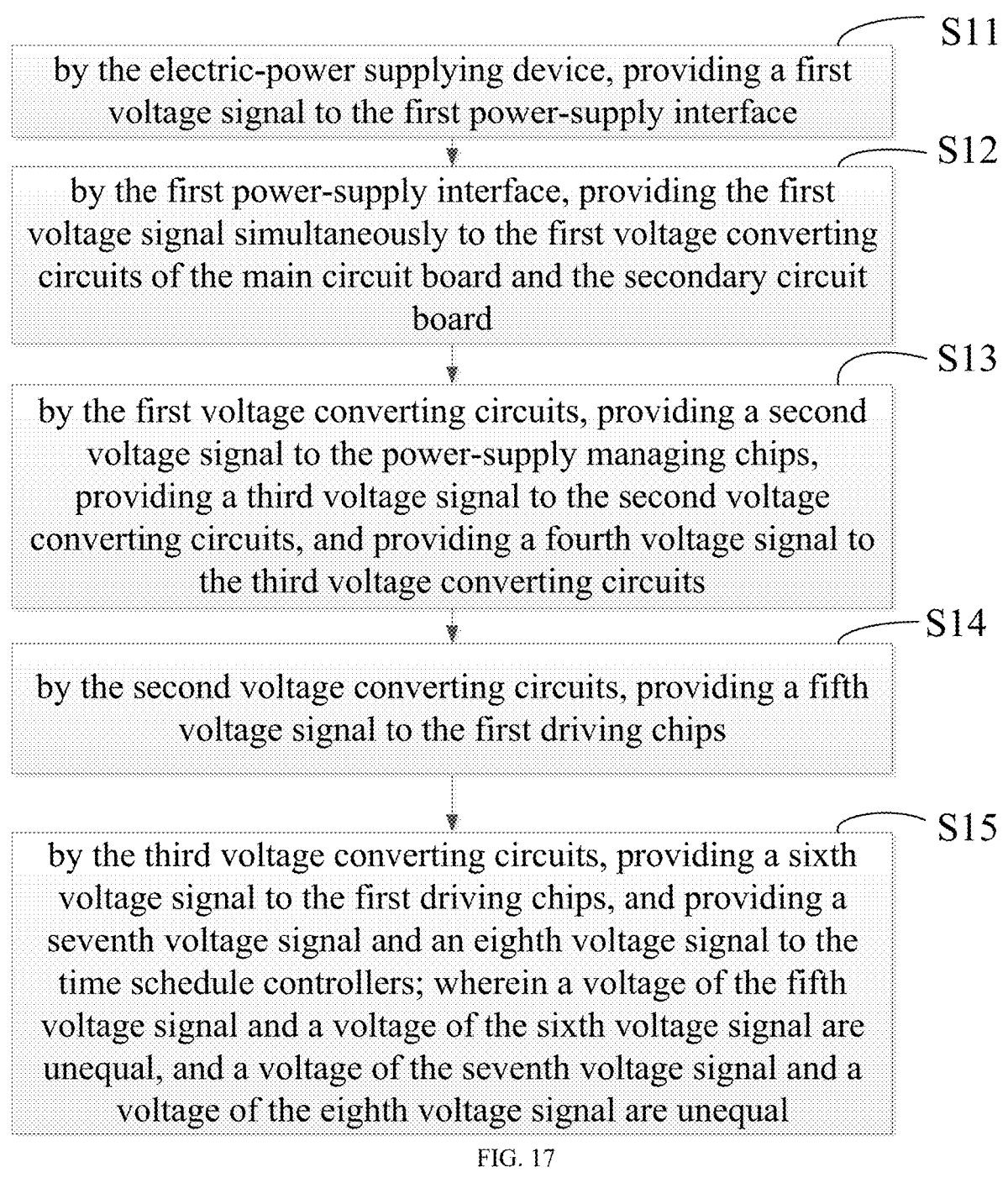

S11: by the electric-power supplying device, providing a first voltage signal to the first power-supply interface S12: by the first power-supply interface, providing the first voltage signal simultaneously to the first voltage converting circuits of the main circuit board and the secondary circuit board S13: by the first voltage converting circuits, providing a second voltage signal to the power-supply managing chips, providing a third voltage signal to the second voltage converting circuits, and providing a fourth voltage signal to the third voltage converting circuits S14: by the second voltage converting circuits, providing a fifth voltage signal to the first driving chips S15: by the third voltage converting circuits, providing a sixth voltage signal to the first driving chips, and providing a seventh voltage signal and an eighth voltage signal to the time schedule controllers; wherein a voltage of the fifth voltage signal and a voltage of the sixth voltage signal are unequal, and a voltage of the seventh voltage signal and a voltage of the eighth voltage signal are unequal

FIG. 17

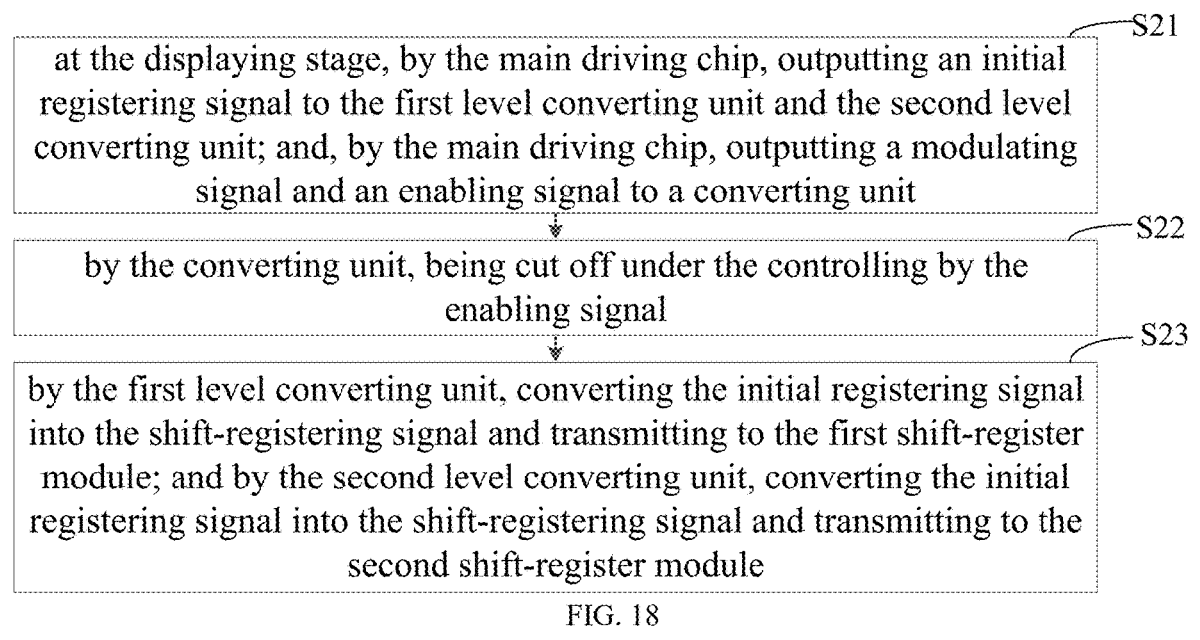

S21: at the displaying stage, by the main driving chip, outputting an initial registering signal to the first level converting unit and the second level converting unit; and, by the main driving chip, outputting a modulating signal and an enabling signal to a converting unit S22: by the converting unit, being cut off under the controlling by the enabling signal S23: by the first level converting unit, converting the initial registering signal into the shift-registering signal and transmitting to the first shift-register module; and by the second level converting unit, converting the initial registering signal into the shift-registering signal and transmitting to the second shift-register module

FIG. 18

S41: at the touch-controlling stage, by all of the first driving chips, receiving the touch-controlling signal from the display panel, wherein all of the first driving chips include one main driving chip and secondary driving chips besides the main driving chip S42: by the secondary driving chips, transmitting the touch-controlling signal from the display panel to the main driving chip S43: by the main driving chip, transmitting the touch-controlling signal to the system chip

FIG. 20

S51: in the frame-sharing state, by the system chip, transmitting the white-frame image signal into the visual-angle controlling panel S52: in the frame-peeping-prevention state, by the system chip, transmitting the white-frame image signal into all of the second pixel units, and transmitting the black-frame image signal into at least some of the first pixel units

FIG. 21

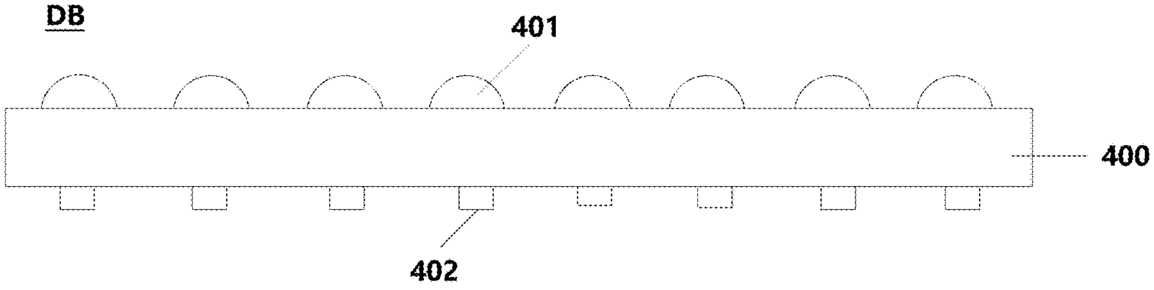

FIG. 22

DISPLAY DEVICE AND DRIVING METHOD THEREFOR, AND VEHICLE

CROSS REFERENCE TO RELEVANT APPLICATIONS

The present application claims the priority of the Chinese patent application filed on May 22, 2023 before the Chinese Patent Office with the application number of 202310582872.2 and the title of "DISPLAY DEVICE AND DRIVING METHOD THEREFOR, AND VEHICLE", which is incorporated herein in its entirety by reference.

TECHNICAL FIELD

The present application relates to the technical field of displaying, and particularly relates to a displaying device and a driving method thereof, and a travelling tool.

BACKGROUND

With the continuous development of the automotive electronic technology and the diversification of the functions of intelligent cabins, the industry has a quickly growing demand on onboard big screens from an A-pillar to an A-pillar. However, in the conventional spliced screens, the splicing seams cannot be removed, which affects the visual effect.

SUMMARY

The embodiments of the present application employ the following technical solutions:

In the first aspect, an embodiment of the present application provides a displaying device, wherein the displaying device comprises:

a backlight module, wherein the backlight module comprises at least one lamp board;

a display panel located on one side of the backlight module;

at least two first driving-chip groups, wherein each of the first driving-chip groups comprises at least two first driving chips, and all of the first driving chips are electrically connected to the display panel;

at least two first circuit boards, wherein each of the first circuit boards is electrically connected to one instance of the first driving-chip groups, the first circuit boards are cascaded to each other, and at least some of signals transmitted in the first circuit boards are synchronous; and the first circuit boards are electrically connected to the backlight module; and a system chip, electrically connected to the first circuit boards, and configured for providing at least two channels of a same video signal to the at least two first circuit boards, and receiving a touch-controlling signal from the display panel.

In at least one embodiment of the present application, the displaying device comprises two instances of the first driving-chip groups and two instances of the first circuit boards;

each of the first driving-chip groups comprises eight instances of the first driving chips, each of the first circuit boards comprises a time schedule controller, and signals of the two time schedule controllers are synchronous with each other;

each of the time schedule controllers is electrically connected to the first driving chips in one instance of the first driving-chip groups; and the time schedule controllers are configured for performing type conversion to the video signal, and transmitting the video signals obtained by the conversion to the first driving chips.

In at least one embodiment of the present application, the two first circuit boards include a main circuit board and a secondary circuit board, the main circuit board further comprises a first electric-power supplying module, a second electric-power supplying module and a first connector, the secondary circuit board further comprises the first electric-power supplying module, the second electric-power supplying module and the first connector, the first electric-power supplying module is electrically connected to the display panel, the second electric-power supplying module is electrically connected to the backlight module, and the first connector is electrically connected to the system chip;

the main circuit board comprises a first power-supply interface, the first power-supply interface is electrically connected to the first electric-power supplying module and an electric-power supplying device, and the first power-supply interface is configured for supplying electric power simultaneously to the first electric-power supplying modules of the main circuit board and the secondary circuit board; and each of the main circuit board and the secondary circuit board comprises a second power-supply interface, the second power-supply interface is electrically connected to the second electric-power supplying module and the electric-power supplying device, and the second power-supply interface is configured for supplying electric power to the second electric-power supplying module.

In at least one embodiment of the present application, each of the first electric-power supplying module of the main circuit board and the first electric-power supplying module of the secondary circuit board comprises a first voltage converting circuit, a second voltage converting circuit, a third voltage converting circuit and a power-supply managing chip; and the first power-supply interface is electrically connected to the first voltage converting circuit, the first voltage converting circuit is electrically connected to the power-supply managing chip, the second voltage converting circuit and the third voltage converting circuit, the second voltage converting circuit is electrically connected to the first driving chips, and the third voltage converting circuit is electrically connected to the time schedule controller and the first driving chips.

In at least one embodiment of the present application, the second electric-power supplying module comprises a second connector and two fourth voltage converting circuits;

the second connector is electrically connected to the lamp board, and each of the fourth voltage converting circuits is electrically connected to the second power-supply interface and the second connector;

the backlight module comprises two instances of the lamp board; and the two fourth voltage converting circuits in a same one instance of the second electric-power supplying module are configured for supplying electric power to a same one instance of the lamp boards.

In at least one embodiment of the present application, the displaying device further comprises at least two third connectors, each of the third connectors is electrically connected to the main circuit board and the secondary circuit board, the first electric-power supplying module of the secondary circuit board is electrically connected to the first power-supply interface by the third connector, and the time schedule controller of the main circuit board and the time schedule controller of the secondary circuit board are electrically connected by the third connector.

In at least one embodiment of the present application, the lamp boards are electrically connected to the second connector, and each of the two lamp boards comprises:

a base board;

a plurality of light regions that are located on one side of the base board and are arranged in an array, wherein each of the light regions contains at least one light emitting device; and a plurality of minisized chips located on one side of the base board that is farther from the light emitting device, wherein each of the minisized chips is electrically connected to the light emitting device within one instance of the light regions; and all of the minisized chips in a same one instance of the lamp boards are electrically connected to a same one instance of the time schedule controllers, and the time schedule controller is configured for, by using the minisized chips, controlling the light regions of the lamp board to emit light in a region-division mode.

In at least one embodiment of the present application, all of the first driving chips include one main driving chip and secondary driving chips besides the main driving chip, the main driving chip is electrically connected to the main circuit board, and all of the first driving chips are cascaded; and each of the secondary driving chips is configured for transmitting the touch-controlling signal from the display panel to the main driving chip, and the main driving chip is configured for transmitting the touch-controlling signal to the system chip.

In at least one embodiment of the present application, the display panel comprises a first shift-register module and a second shift-register module that are located on two sides of a displaying region; and the main driving chip is configured for controlling to transmit a shift-registering signal to the first shift-register module and the second shift-register module.

In at least one embodiment of the present application, the main circuit board comprises a first converting unit, the secondary circuit board comprises a second converting unit, the first converting unit is electrically connected to the main driving chip and the first shift-register module, and the second converting unit is electrically connected to the main driving chip and the second shift-register module; and the first converting unit and the second converting unit are configured for, under controlling by the main driving chip, generating the shift-registering signal.

In at least one embodiment of the present application, a minimum distance between the first converting unit and the first shift-register module and a minimum distance between the second converting unit and the second shift-register module are substantially equal.

In at least one embodiment of the present application, the main circuit board further comprises a converting module, and the converting module is electrically connected to the main driving chip and the power-supply managing chip of the main circuit board;

the converting module is electrically connected to the first converting unit and the second converting unit;

the main driving chip is configured for controlling the converting module to be switched between a displaying stage and a touch-controlling stage;

at the touch-controlling stage, the converting module is configured for being capable of receiving a modulating signal transmitted by the main driving chip and a first level signal transmitted by the power-supply managing chip, superposing the first level signal and the modulating signal, and subsequently outputting to the first converting unit and the second converting unit; and at the displaying stage, the converting module is configured for being capable of receiving the first level signal transmitted by the power-supply managing chip, and transmitting the outputted signal to the first converting unit and the second converting unit.

In at least one embodiment of the present application, the display panel comprises a light sensing sensor, and the displaying device further comprises a light-sensation processor;

the light sensing sensor is electrically connected to the light-sensation processor by the first circuit boards;

the light-sensation processor is electrically connected to the time schedule controllers;

the light sensing sensor is configured for converting a collected optical signal into an electric signal and transmitting to the light-sensation processor;

the light-sensation processor receives the electric signal, performs signal processing to the electric signal, and subsequently outputs a light regulating signal to the time schedule controllers; and the time schedule controllers generate controlling signals according to the light regulating signal and transmit the controlling signals to the minisized chips.

In at least one embodiment of the present application, the displaying device further comprises a visual-angle controlling panel and a privacy film, and the visual-angle controlling panel is located between the backlight module and the display panel;

the privacy film covers at least part of a region of a light-exiting face of the backlight module; and the displaying device further comprises at least two second driving-chip groups and at least two second circuit boards, each of the second driving-chip groups comprises at least one second driving chip, all of the second driving chips are electrically connected to the visual-angle controlling panel, each of the second driving-chip groups is electrically connected to one instance of the second circuit boards, the second circuit boards are cascaded to each other, one instance of the second circuit boards is electrically connected to the system chip, and the system chip is configured for transmitting an image signal to the second circuit board.

In at least one embodiment of the present application, the displaying device further comprises a camera, the backlight module is provided with a mounting hole, and the camera is provided in the mounting hole;

each of the display panel and the visual-angle controlling panel is provided with a light transmitting region, and orthographic projections of the light transmitting regions on the camera cover the camera; and the displaying device further comprises a controlling board, and the controlling board is electrically connected to the camera and the system chip.

In at least one embodiment of the present application, the system chip comprises a hand-gesture identifying module, and the hand-gesture identifying module is electrically connected to the controlling board;

the camera is configured for collecting hand-gesture-action information of a driving person, and transmitting the hand-gesture-action information to the controlling board, and the controlling board is configured for receiving the hand-gesture-action information and feeding back the hand-gesture-action information into the hand-gesture identifying module; and the hand-gesture identifying module is configured for storing a predetermined relation between the hand-gesture-action information and an instruction signal, determining the instruction signal according to the hand-gesture-action information, and according to the instruction signal, controlling the display panel to execute a corresponding operation.

In at least one embodiment of the present application, the system chip comprises a driving-person monitoring module, and the driving-person monitoring module is electrically connected to the controlling board;

the camera is configured for monitoring a driving behavior of a driving person, and transmitting driving-behavior information to the controlling board;

the controlling board is configured for receiving the driving-behavior information and feeding back the driving-behavior information to the driving-person monitoring module; and the driving-person monitoring module is configured for receiving the driving-behavior information and, according to the driving-behavior information, transmitting a video signal having a prompting message to the display panel.

In at least one embodiment of the present application, the display panel comprises a touch-controlling layer, the touch-controlling layer comprises a plurality of touch-controlling electrodes and a hollowed-out part, orthographic projections of the touch-controlling electrodes on a substrate of the display panel are within a region outside the light transmitting region, and an orthographic projection of the hollowed-out part on the substrate of the display panel is within the light transmitting region.

In at least one embodiment of the present application, the touch-controlling electrodes include a plurality of first touch-controlling electrodes and a plurality of second touch-controlling electrodes, the plurality of first touch-controlling electrodes surround the hollowed-out part, a minimum distance between the first touch-controlling electrodes and an edge of the hollowed-out part is less than a planar dimension of each of the second touch-controlling electrodes, and an area of a planar pattern of each of the first touch-controlling electrodes is 107%-110% of an area of a planar pattern of each of the second touch-controlling electrodes.

In at least one embodiment of the present application, the displaying device comprises an instrument-provision region, a center-control region and an entertainment region, and the center-control region is located between the instrument-provision region and the entertainment region;

the privacy film is provided within the entertainment region; and in a frame-sharing state, the time schedule controllers are configured for controlling brightnesses of a part of the light emitting devices that are located within the entertainment region to be greater than brightnesses of a part of the light emitting devices that are located within the instrument-provision region and the center-control region, and brightnesses of the instrument-provision region, the center-control region and the entertainment region of the displaying device to be equal.

In at least one embodiment of the present application, the image signal comprises a white-frame image signal and a black-frame image signal; and in the frame-sharing state, the system chip is configured for transmitting the white-frame image signal into the visual-angle controlling panel.

In at least one embodiment of the present application, the visual-angle controlling panel comprises a plurality of first pixel units and a plurality of second pixel units besides the first pixel units, an orthographic projection of the privacy film on the visual-angle controlling panel covers the first pixel units, and the plurality of first pixel units are located within the entertainment region; and in a frame-peeping-prevention state, the system chip is configured for transmitting the white-frame image signal into all of the second pixel units, and transmitting the black-frame image signal into at least some of the first pixel units.

In at least one embodiment of the present application, the displaying device comprises two instances of the second driving-chip groups and two instances of the second circuit boards, a first instance of the second driving-chip groups comprises two instances of the second driving chip, and a second instance of the second driving-chip groups comprises one instance of the second driving chip;

the second instance of the driving-chip groups is electrically connected to a part of the visual-angle controlling panel that is located within the entertainment region; and in the frame-peeping-prevention state, the system chip is configured for, by using the second instance of the driving-chip groups, transmitting the black-frame image signal to the part of the visual-angle controlling panel that is located within the entertainment region.

In at least one embodiment of the present application, the displaying device comprises a cover plate, the cover plate covers the display panel, and a planar size of the cover plate is greater than a planar size of the display panel;

a part of the cover plate that is located within the center-control region is provided with at least two exciters, the two exciters are located on one side of the cover plate that is closer to the backlight module, and the two exciters are located on two opposite lateral sides of the cover plate; and the exciters are electrically connected to the display panel, and the exciters are configured for vibrating after the display panel has received a touch-controlling operation, wherein the touch-controlling operation includes sliding and pressing.

In at least one embodiment of the present application, the cover plate comprises a first region and a second region besides the first region, and an orthographic projection of the camera on the cover plate is within the first region; and the cover plate comprises a first surface, the first surface is closer to the display panel, a first printing-ink layer is provided at a part of the first surface that is located within the first region, a second printing-ink layer is provided at a part of the first surface that is located within the second region, the first printing-ink layer is configured for being capable of transmitting displaying light rays of the display panel, and the second printing-ink layer is configured for being capable of transmitting infrared light rays.

In at least one embodiment of the present application, a resolution of the visual-angle controlling panel is ⅙-½ of a resolution of the display panel.

In the second aspect, an embodiment of the present application provides a driving method of a displaying device, wherein the method is applied for the displaying device in the first aspect, and the method comprises:

- by the electric-power supplying device, providing a first voltage signal to the first power-supply interface;
- by the first power-supply interface, providing the first voltage signal simultaneously to the first voltage converting circuits of the main circuit board and the secondary circuit board;
- by the first voltage converting circuits, providing a second voltage signal to the power-supply managing chips, providing a third voltage signal to the second voltage converting circuits, and providing a fourth voltage signal to the third voltage converting circuits;
- by the second voltage converting circuits, providing a fifth voltage signal to the first driving chips; and
- by the third voltage converting circuits, providing a sixth voltage signal to the first driving chips, and providing a seventh voltage signal and an eighth voltage signal to the time schedule controllers;
- wherein a voltage of the fifth voltage signal and a voltage of the sixth voltage signal are unequal, and a voltage of the seventh voltage signal and a voltage of the eighth voltage signal are unequal.

In at least one embodiment of the present application, the method further comprises:

- at the displaying stage, by the main driving chip, outputting an initial registering signal to the first converting unit and the second converting unit; and, by the main driving chip, outputting a modulating signal and an enabling signal to a converting unit;
- by the converting unit, under controlling by the enabling signal, being not capable of receiving the modulating signal from the main driving chip;
- by the first converting unit, converting the initial registering signal into the shift-registering signal and transmitting to the first shift-register module; and
- by the second converting unit, converting the initial registering signal into the shift-registering signal and transmitting to the second shift-register module.

In at least one embodiment of the present application, the method further comprises:

- at the touch-controlling stage, by the main driving chip, outputting the modulating signal and the enabling signal;
- by the power-supply managing chip, outputting the first level signal;
- by the converting unit, receiving the first level signal, under controlling by the enabling signal, receiving the modulating signal, superposing the first level signal and the modulating signal, and subsequently outputting the signal obtained by the superposition;
- by the first converting unit and the second converting unit, simultaneously receiving the signal obtained by the superposition;
- by the first converting unit, converting the signal obtained by the superposition into a shift-registering signal obtained after superposition and transmitting to the first shift-register module; and
- by the second converting unit, converting the signal obtained by the superposition into a shift-registering signal obtained after superposition and transmitting to the second shift-register module.

In at least one embodiment of the present application, the method further comprises:

- at the touch-controlling stage, by all of the first driving chips, receiving the touch-controlling signal from the display panel, wherein all of the first driving chips include one instance of the main driving chip and the secondary driving chips besides the main driving chip;
- by the secondary driving chips, transmitting the touch-controlling signal from the display panel to the main driving chip; and
- by the main driving chip, transmitting the touch-controlling signal to the system chip.

In at least one embodiment of the present application, the method further comprises:

- in the frame-sharing state, by the system chip, transmitting the white-frame image signal into the visual-angle controlling panel; and
- in the frame-peeping-prevention state, by the system chip, transmitting the white-frame image signal into all of the second pixel units, and transmitting the black-frame image signal into at least some of the first pixel units.

In the third aspect, an embodiment of the present application provides a travelling tool, wherein the travelling tool comprises the displaying device according to any one of the embodiments in the first aspect, and the displaying device is located between two A-pillars of the travelling tool.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application will be provided below.

BRIEF DESCRIPTION OF THE DRAWINGS

In order to more clearly illustrate the technical solutions of the embodiments of the present application or the prior art, the figures that are required to describe the embodiments or the prior art will be briefly described below. Apparently, the figures that are described below are merely embodiments of the present application, and a person skilled in the art can obtain other figures according to these figures without paying creative work.

FIG. 11 is a schematic diagram of a visual-angle controlling panel according to an embodiment of the present application in a frame-sharing state;

FIG. 12 is a schematic diagram of a visual-angle controlling panel according to an embodiment of the present application in a frame-peeping-prevention state;

FIG. 13 is a schematic structural diagram of a touch-controlling layer in a display panel according to an embodiment of the present application;

FIGS. 17-21 are flow charts of five driving methods of a displaying device according to embodiments of the present application; and FIG. 22 is a schematic structural diagram of a lamp board according to an embodiment of the present application.

DETAILED DESCRIPTION

Figure 1:
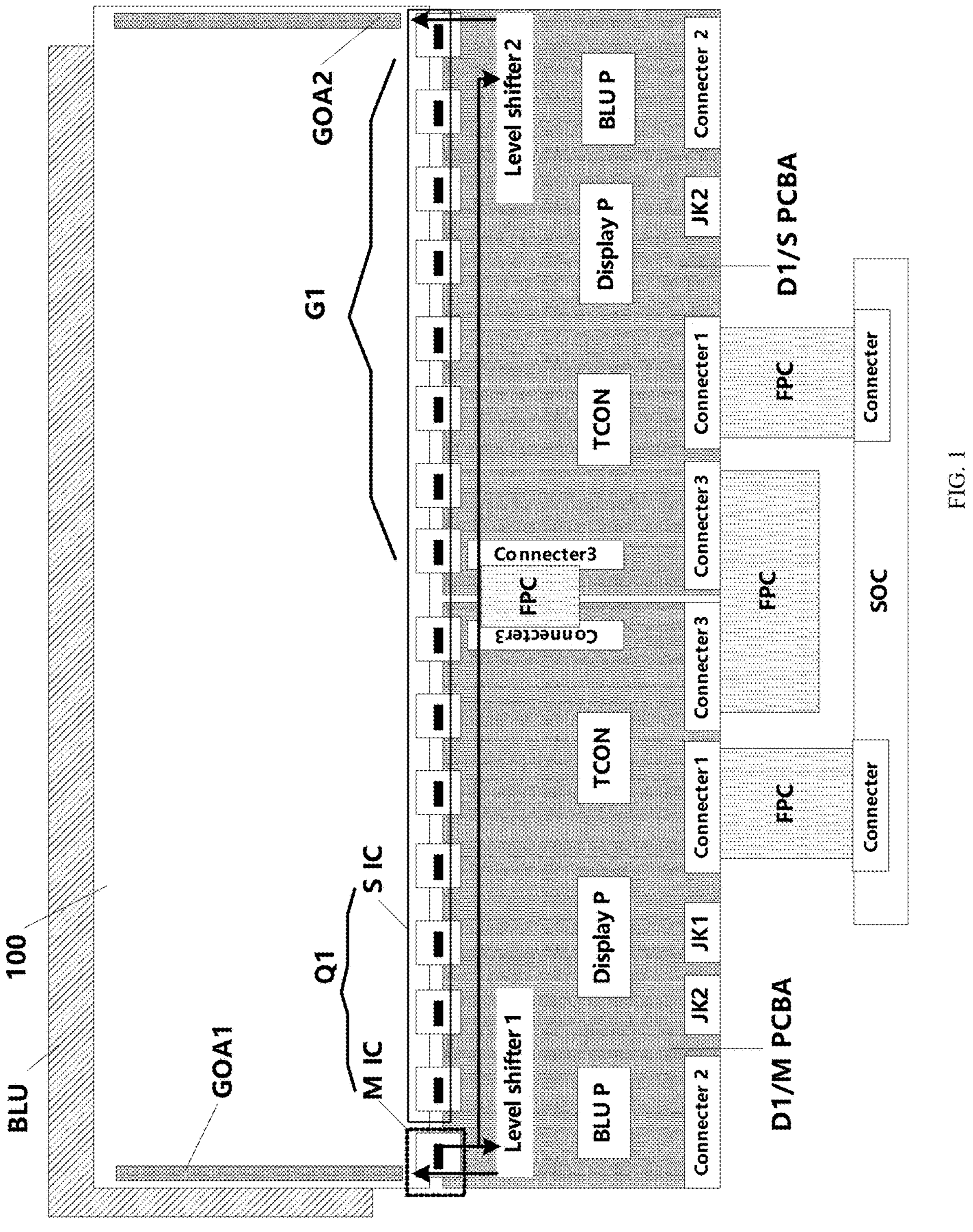
FIG. 1 is a schematic diagram of the driving architecture of a displaying device according to an embodiment of the present application.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the embodiments of the present application, terms such as "first", "second", "third" and "fourth" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

In the embodiments of the present application, the terms that indicate orientation or position relations, such as "upper" and "lower", are based on the orientation or position relations shown in the drawings, and are merely for conveniently describing the present application and simplifying the description, rather than indicating or implying that the device or element must have the specific orientation and be constructed and operated according to the specific orientation. Therefore, they should not be construed as a limitation on the present application.

In the description of the present application, the terms "one embodiment", "some embodiments", "exemplary embodiment", "example", "specific example" or "some examples" are intended to indicate that specific features, structures, materials or characteristics related to the embodiment or example are comprised in at least one embodiment or example of the present application. The illustrative indication of the above terms does not necessarily refer to the same one embodiment or example. Moreover, the specific features, structures, materials or characteristics may be comprised in any one or more embodiments or examples in any suitable manner.

In the embodiments of the present application, the meaning of "plurality of" is "two or more", and the meaning of "at least one" is "one or more", unless explicitly and particularly defined otherwise.

All of the features used in the embodiments of the present application of "parallel", "perpendicular", "the same" and so on include the features of "parallel", "perpendicular", "the same" and so on in the strict sense, and include the cases in which there is a certain tolerance such as "substantially parallel", "substantially perpendicular" and "substantially the same", taking into consideration the measurement and the tolerances relevant to the measurement on particular quantities (for example, restricted by the measuring system), and represent that they are in the acceptable deviation ranges of the particular values determined by a person skilled in the art. For example, the "substantially" can represent that they are within one or more standard deviations, or within 3% or 5% of the values.

Unless stated otherwise in the context, throughout the description and the claims, the term "comprise" is interpreted as the meaning of opened containing, i.e., "including but not limited to".

The polygons in the description are not the strictly defined polygons, may be an approximate triangle, parallelogram, rectangle, trapezoid, pentagon, hexagon and so on, and may have some small deformations caused by tolerance.

With the continuous development of the automotive electronic technology and the diversification of the functions of intelligent cabins, the industry has a quickly growing demand on onboard big screens from an A-pillar to an A-pillar. However, in the conventional spliced screens, the splicing seams cannot be removed, which affects the visual effect.

In view of the above, the embodiments of the present application provide a displaying device and a driving method thereof, and a travelling tool. The displaying device is an integrated display screen, and can provide an extremely good image quality, to provide the user a more comfortable and more thrilling visual experience.

The displaying device and the driving method thereof, and the travelling tool according to the embodiments of the present application will be described particularly below with reference to the drawings.

An embodiment of the present application provides a displaying device. As shown in FIG. 1, the displaying device comprises:

- a backlight module BLU, wherein the backlight module BLU comprises at least one lamp board DB shown in FIG. 22;
- a display panel 100 located on one side of the backlight module BLU;
- at least two first driving-chip groups G1, wherein each of the first driving-chip groups G1 comprises at least two first driving chips Q1, and all of the first driving chips Q1 are electrically connected to the display panel 100;
- at least two first circuit boards D1, wherein each of the first circuit boards D1 is electrically connected to one first driving-chip group G1, the first circuit boards D1 are cascaded to each other, and at least some of the signals transmitted in the first circuit boards D1 are synchronous; and the first circuit boards D1 are electrically connected to the backlight module BLU (not shown in FIG. 1); and a system chip SOC, electrically connected to the first circuit boards D1, and configured for providing at least two channels of the same video signal (for example, an EDP signal) to the at least two first circuit boards D1, and receiving a touch-controlling signal from the display panel.

The type of the lamp board DB is not limited herein. As an example, the lamp board DB may be an LED (Light Emitting Diode) lamp board DB. Alternatively, the lamp board DB may be a Mini LED (Mini Light Emitting Diode) lamp board DB. Alternatively, the lamp board DB may be a Micro LED (Micro Light Emitting Diode) lamp board DB.

The embodiments of the present application illustrate by taking the case as an example in which the lamp board comprises a Mini LED lamp board or a Micro LED lamp board. The size of the Mini LED ranges 100 μm-300 μm, and the size of the Micro LED ranges 0 μm-100 μm.

The emitted-light color of the backlight module is not limited herein. As an example, all of the emitted-light colors of light emitting devices 401 in the lamp boards DB may be the same. For example, all of the light emitting devices 401 emit blue-color light rays. As another example, all of the light emitting devices 401 emit white-color light rays.

The backlight module may further comprise a plurality of optical film layers located on the light exiting side of the lamp board DB, for example, a diffuser plate, a quantum-dot film, a diffuser sheet and a composite film that are sequentially arranged in the direction away from the lamp board DB. The diffuser plate and the diffuser sheet can improve the lamp shadow generated by the backlight module, to improve the displaying image quality of the displaying device. The quantum-dot film can, by the excitation by the blue light emitted by the light emitting devices 401 in the lamp board DB, convert the blue light into white light, which can increase the utilization ratio of the light energy of the backlight module. The composite film may be used to increase the brightness of the light rays exiting the diffuser sheet.

The display panel may be an LCD (Liquid Crystal Display) display panel. The LCD display panel may include liquid-crystal display panels such as the TN (Twisted Nematic) type, the VA (Vertical Alignment) type, the IPS (In-Plane Switching) type and the ADS (Advanced Super Dimension Switch) type. The liquid-crystal display panel may comprise a color-film base board and an array base board, and may further comprise a liquid-crystal layer located between the color-film base board and the array base board. Certainly, it may further comprise other components such as a driving circuit. Merely the components that are relevant to the inventiveness are described herein, and the other components of the display panel may be obtained according to the related art or common knowledge, and are not discussed further herein.

The first driving chips Q1 refer to the driving chips used for driving the display panel 100. In order for distinguishing, second driving chips Q2 will be involved below, wherein the second driving chips Q2 refer to the driving chips used for driving a visual-angle controlling panel 200.

That at least some of the signals transmitted in the first circuit boards D1 are synchronous includes the following cases: some of the signals in the first circuit boards D1 are synchronous, or all of the signals in the first circuit boards D1 are synchronous.

As an example, the signals that are synchronous in the first circuit boards D1 may include at least one of the signals transmitted by the time schedule controllers of the first circuit boards D1, displaying driving signals that are required to be cascaded in all of the first driving chips Q1, and touch-controlling controlling signals. The displaying driving signals that are required to be cascaded in all of the first driving chips Q1 include but are not limited to common-voltage signals (Vcom signals).

The system chip SOC (System-on-a-Chip) refers to a chip of an integrated circuit, and is also referred to as an on-chip system, which means that it is a product, is an integrated circuit having a dedicated target, and comprises a complete system and all of the contents of embedded software.

The above-described "providing at least two channels of the same video signal to the at least two first circuit boards D1" has the following meanings: the quantity of the first circuit boards D1 and the quantity of the channels of the video signals are equal, and, in some embodiments, the video signals received by each of the first circuit boards D1 are the same.

As an example, when the resolution of the display panel is 10K*1K, the system chip SOC may transmit two same 5K EDP signals to two first circuit boards D1.

The EDP signal is a signal transmitted via the EDP interface. The EDP (Embedded Display Port) interface is a fully digitalized interface based on the DisplayPort architecture and protocol, can transmit high-resolution signals by using simple connectors and few leads, and can realize simultaneous transmission of multiple data. An EDP signal mainly comprises three parts of the data channels of Main Link, AUX CH and HPD. Main Link represents the main channel, and is used for transmitting various types of video data and audio data. AUX CH represents the auxiliary channel, and is used for transmitting data of low bandwidth demands, and the signals for link management and device controlling. HPD represents the hot-plugging detecting channel.

As an example, the first circuit boards D1 may be PCBA boards (Printed Circuit Board Assembly, or integrated printed circuit board), wherein the PCBA board is also referred to as a PCB board.

All of the first circuit boards D1 according to the embodiments of the present application are electrically connected to the data lines in the display panel, and are located on the upper side or the lower side of the display panel (the first circuit boards D1 are located at one end of the data lines). In this case, the first circuit boards D1 are XPCB boards. The second circuit boards described below are similar, wherein the second circuit boards are also XPCB boards.

In an exemplary embodiment, the display panel may be a touch-controlled display panel. In this case, the first driving chips Q1 may be electrically connected to the data lines (Data lines) and the touch-controlling lines (TX lines) in the display panel, and are configured for providing the displaying driving signals to the data lines, and providing touch-controlling driving signals to the touch-controlling lines.

As an example, the first driving chips Q1 may be SRIC (Source/Read-out IC) type driving chips. Alternatively, the first driving chips Q1 may be TDDIC (Touch with Display Driver IC) type driving chips. Alternatively, the first driving chips Q1 may be LTDI IC (Large Touch with Display Driver IC) type driving chips.

The TDDIC chip is obtained by integrating the touch-controlling chip and the displaying chip into a single chip. The LTDI IC is a new technique that is developed based on TDDIC and applied in large-sized display panels, to satisfy the demands on large screens.

As an example, the display panel may be a high resolution (for example, 8K-10K, and PPI 200-250) and high contrast (for example, a contrast of 80000:1-100000:1) display panel.

As an example, the displaying device may be used for outdoor displaying. Alternatively, the displaying device may be used for onboard displaying.

When the displaying device is used for onboard displaying, the length-width ratio of the display panel is approximately 10:1.

In the embodiments of the present application, by configuring that the displaying device comprises the backlight module, the display panel, the at least two first driving-chip groups G1, the at least two first circuit boards D1 and the system chip, the backlight module BLU comprises at least one lamp board DB, each of the first driving-chip groups G1 comprises at least two first driving chips Q1, all of the first driving chips Q1 are electrically connected to the display panel 100, each of the first circuit boards D1 is electrically connected to one first driving-chip group, the first circuit boards D1 are cascaded to each other, at least some of the signals transmitted in the first circuit boards D1 are synchronous, the first circuit boards D1 are electrically connected to the backlight module BLU (not shown in FIG. 1), and the system chip SOC is electrically connected to the first circuit boards D1, and configured for providing at least two channels of the same video signal (for example, an EDP signal) to the at least two first circuit boards D1, and receiving the touch-controlling signal from the display panel, the present application, by providing a novel integrated large-sized touch-controlled displaying device and its driving architecture, solves the problem that, in the conventional spliced screens, the splicing seams cannot be removed, and, by using the driving mode in which the at least two first driving-chip groups are cascaded, can realize an image quality of an ultra-high resolution (for example, 8K-10K, and PPI 200-250) and an ultra-high contrast (for example, a contrast of 80000:1-100000:1), to provide the user a more comfortable and more thrilling visual experience.

It should be noted that, in the figures according to the embodiments of the present application, for example, as shown in FIG. 1, the first driving chips Q1 are represented by black rectangles, the first driving chips Q1 are provided on rectangular Flip-Chip thin films, and the case is taken as an example for the illustration and the description in which the encapsulation type of the first driving chips Q1 is COF. That is not a limitation on the encapsulation type of the first driving chips Q1, and the encapsulation type may also be COG or COP.

COF is also referred to as Flip-Chip thin film (Chip On Flex, or Chip On Film). COG (Chip On Glass) refers to that the first driving chips are directly bonded to the glass base board of the display panel 100. COP (Chip On Plastic) refers to that the first driving chips are bonded to a flexible material of the display panel 100. The particular explanation of the three techniques of COF, COG and COP may refer to the description in the related art, and are not discussed further herein.

Figure 2:
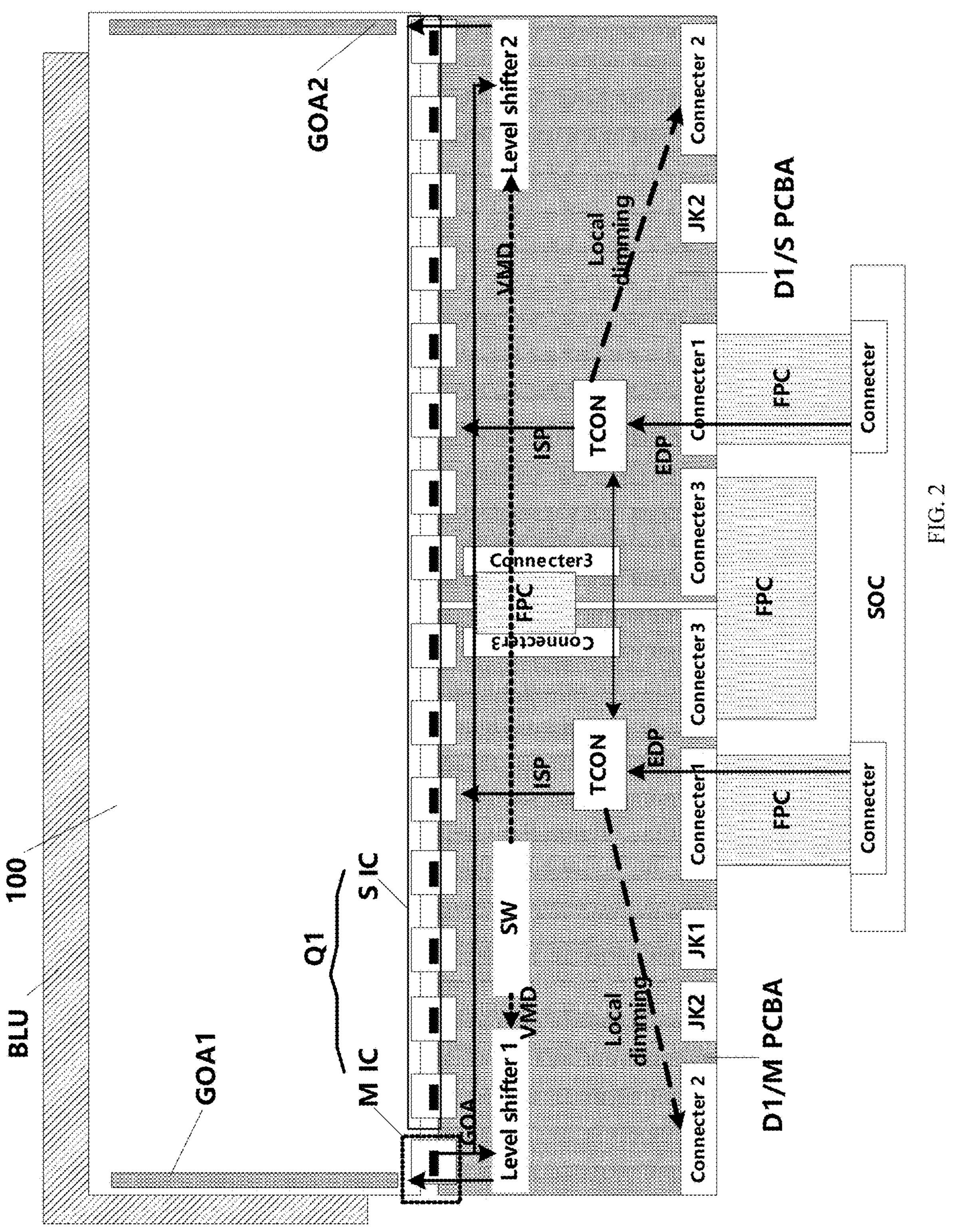
FIG. 2 is a schematic diagram of the signal transmission process in a displaying device according to an embodiment of the present application.

In at least one embodiment of the present application, as shown in FIGS. 1 and 2, the displaying device comprises two first driving-chip groups G1 and two first circuit boards D1. Each of the first driving-chip groups G1 comprises eight first driving chips Q1, each of the first circuit boards D1 comprises a time schedule controller TCON, and the signals of the two time schedule controllers TCON are synchronous with each other. Each of the time schedule controllers TCON is electrically connected to the first driving chips in one first driving-chip group G1. The time schedule controllers TCON are configured for performing type conversion to the video signal (for example, an EDP signal), and transmitting the video signals obtained by the conversion (ISP signals) to the first driving chips Q1.

In an exemplary embodiment, the function of the time schedule controllers (Timer Control Register, TCON), or TCON boards, is processing the video signals (containing at least one of the three types of signals of RGB data signals, clock signals and controlling signals) of the LVDS or EDP type transmitted from the system chip SOC, to convert them into the video signals that can drive the display panel (for example, signals of the ISP type).

ISP (Image Signal Processing) is mainly the signals that are outputted after the front-end output signals have been processed, so as to match display panels of different models. It can be understood that the time schedule controllers TCON process and convert the video signals transmitted from the system chip SOC, to obtain the video signals (ISP signals) that the first driving chips can identify, and subsequently the first driving chips Q1 transmit the signals to the display panel 100, to realize normal displaying of the frames.

In at least one embodiment of the present application, as shown in FIG. 1, the two first circuit boards D1 include a main circuit board M PCBA and a secondary circuit board S PCBA, the main circuit board M PCBA further comprises a first electric-power supplying module Display P (Display Power), a second electric-power supplying module BLU P (BLU Power) and a first connector Connecter1, the secondary circuit board S PCBA further comprises the first electric-power supplying module Display P, the second electric-power supplying module BLU P and the first connector Connecter1, the first electric-power supplying module Display P is electrically connected to the display panel 100, the second electric-power supplying module BLU P is electrically connected to the backlight module BLU, and the first connector Connecter1 is electrically connected to the system chip SOC by a flexible circuit board FPC.

The main circuit board M PCBA comprises a first power-supply interface JK1, the first power-supply interface JK1 is electrically connected to the first electric-power supplying module Display P and an electric-power supplying device, and the first power-supply interface JK1 is configured for supplying electric power simultaneously to the first electric-power supplying modules Display P of the main circuit board M PCBA and the secondary circuit board S PCBA.

Each of the main circuit board M PCBA and the secondary circuit board S PCBA comprises a second power-supply interface JK2, the second power-supply interface JK2 is electrically connected to the second electric-power supplying module BLU P and the electric-power supplying device, and the second power-supply interface JK2 is configured for supplying electric power to the second electric-power supplying module BLU P.

The particular structures of the first electric-power supplying module Display P and the second electric-power supplying module BLU P are not limited herein, and any electric-power supplying module that satisfies the above-described requirement on electric-power supplying fall within the protection scope of the present embodiment.

As an example, the first electric-power supplying module Display P and the second electric-power supplying module BLU P comprise at least a voltage converting circuit (Buck circuit).

As an example, the first electric-power supplying module Display P may further comprise a power-supply managing chip (PMIC, Power Management IC), which is a specific-purpose integrated circuit, and is used for managing the power-supply circuits in the first circuit boards D1, and providing the first driving chips Q1 the voltages that they require. The particular circuit structure and functions of the power-supply managing chip are not limited herein, and may particularly refer to the explanation on the structures and the functions of power-supply managing chips in displaying devices in the related art.

As an example, all of the first connector Connecter 1 and the connectors described below are used for establishing communicating bridges between the blocked parts in the circuits or between the isolated circuits, thereby enabling the electric currents to flow, whereby the circuits realize the predetermined functions. For example, the connectors may include plug-connecting members, a plug and a socket, an extension socket and a female header, and so on.

In an exemplary embodiment, the first power-supply interface JK1 is electrically connected to both of the first electric-power supplying module Display P of the main circuit board M PCBA and the first electric-power supplying module Display P of the secondary circuit board S PCBA, so as to provide the same power-supply signal simultaneously to the two first electric-power supplying modules Display P.

As an example, the first power-supply interface JK1 may be electrically connected to a 12V power-supply adapter, so as to provide a 12V power-supply voltage simultaneously to the two first electric-power supplying modules Display P.

In the displaying device according to the embodiments of the present application, by configuring that the main circuit board M PCBA and the secondary circuit board S PCBA have the respective electric-power supplying modules, and configuring that, in the same one circuit board, the module for supplying electric power to the backlight module BLU and the module for supplying electric power to the display panel 100 are separate, that can simplify the wiring configuration in the circuit boards and reduce the wire resistance to a large extent, so that the voltages that the first driving chips Q1 acquire from the circuit boards are equal, thereby improving the uniformity and the stability of the signals transmitted in the driving chips Q1 in the displaying device, improving the uniformity of the frame brightness of the displaying device, and improve the effect of displaying.

Figure 3:
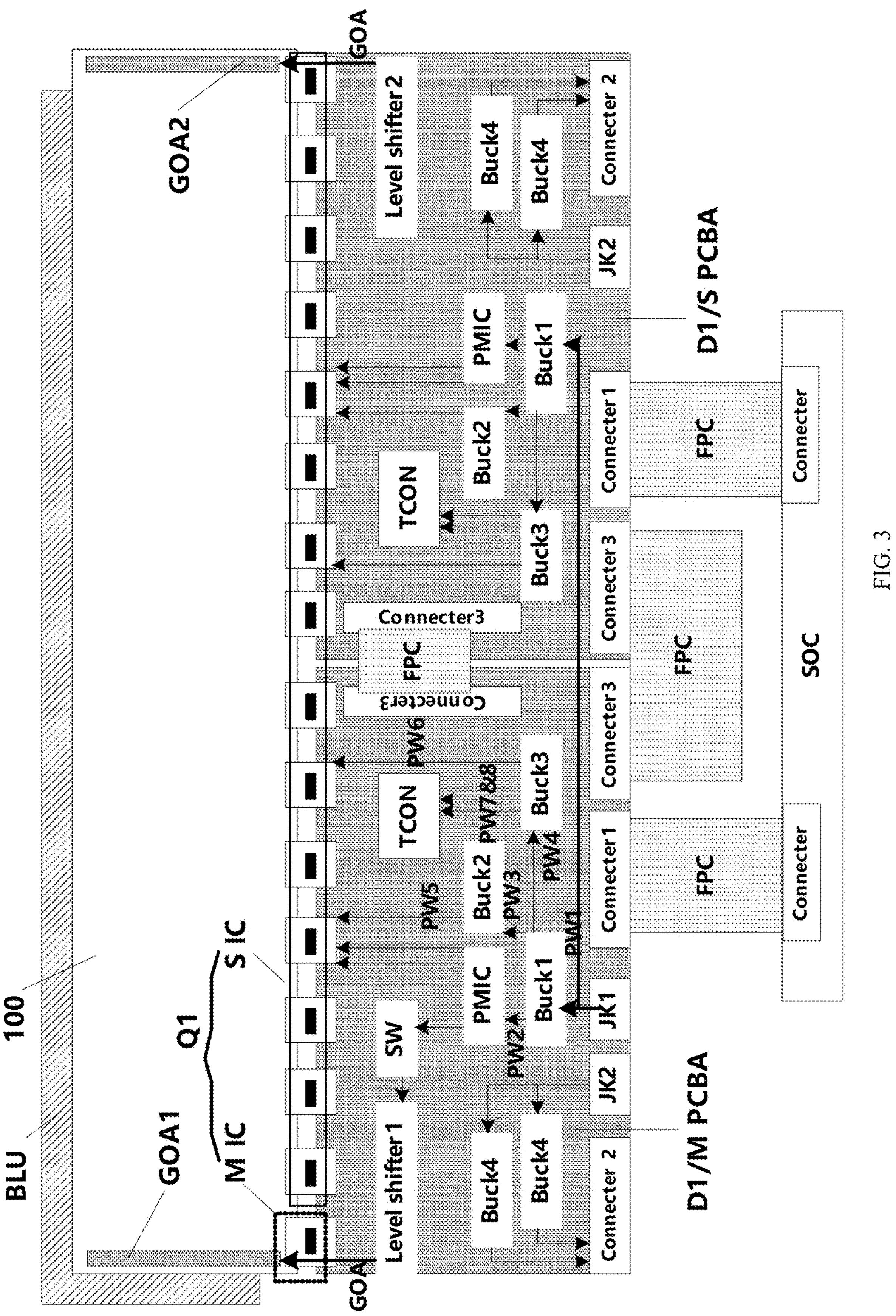
FIG. 3 is a schematic diagram of the electric-power-supplying process in a displaying device according to an embodiment of the present application.

In at least one embodiment of the present application, as shown in FIG. 3, each of the first electric-power supplying module Display P of the main circuit board M PCBA and the first electric-power supplying module Display P of the secondary circuit board S PCBA comprises a first voltage converting circuit Buck1, a second voltage converting circuit Buck2, a third voltage converting circuit Buck3 and a power-supply managing chip PMIC.

Figures 5, 6:
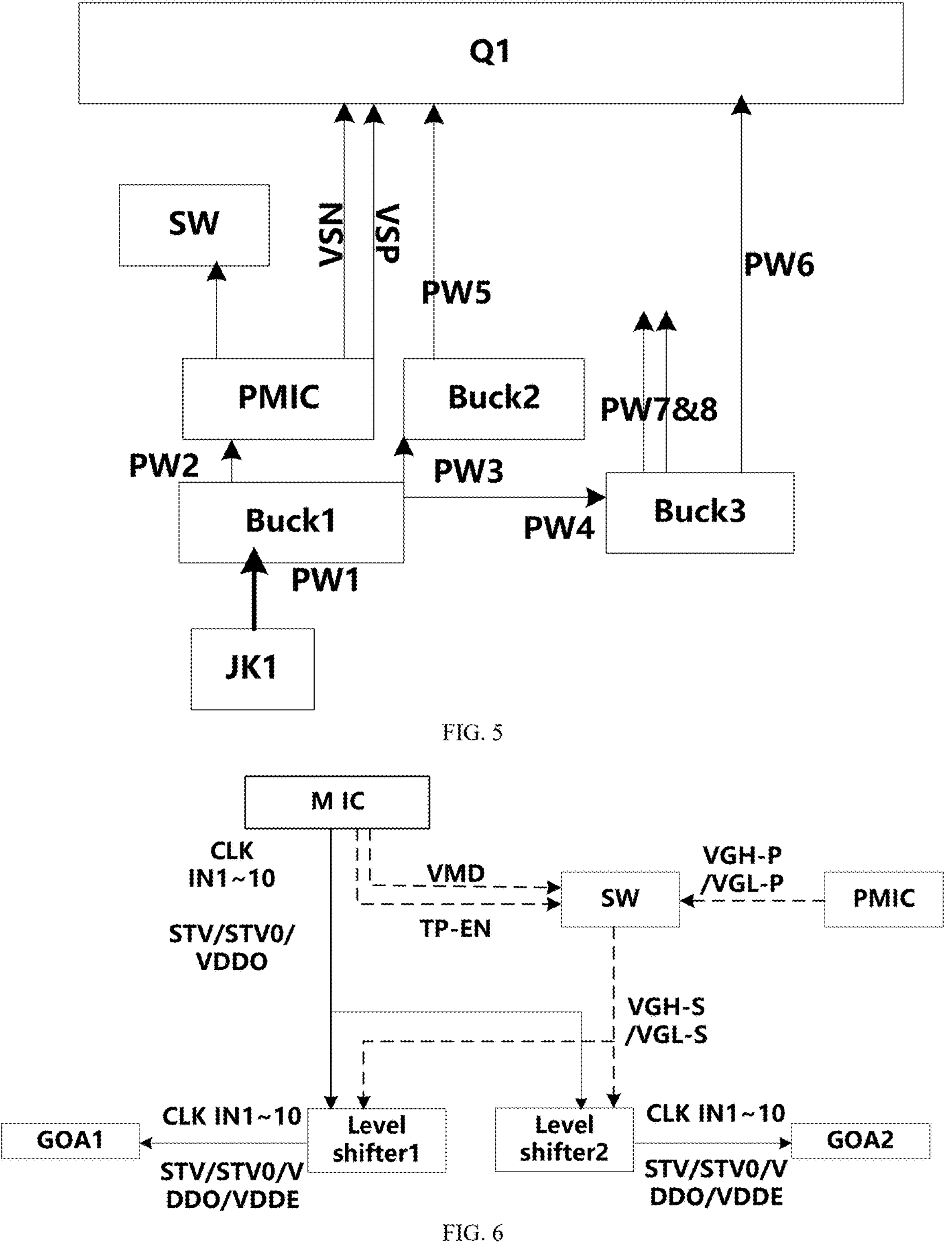
FIG. 5 is a schematic diagram of the electric-power-supplying process of a display panel in a displaying device according to an embodiment of the present application.
FIG. 6 is a diagram for illustrating the operation principle of a converting unit according to an embodiment of the present application.

Referring to FIGS. 3 and 5, the first power-supply interface JK1 is electrically connected to the first voltage converting circuit Buck1, the first voltage converting circuit Buck1 is electrically connected to the power-supply managing chip PMIC, the second voltage converting circuit Buck2 and the third voltage converting circuit Buck3, the second voltage converting circuit Buck2 is electrically connected to the first driving chips Q1, and the third voltage converting circuit Buck3 is electrically connected to the time schedule controller TCON and the first driving chips Q1.

In an exemplary embodiment, the first voltage converting circuit Buck1 may convert the 12V voltage transmitted by the first power-supply interface JK1 into an approximately 5V voltage and subsequently output the voltage. The second voltage converting circuit Buck2 may convert the 5V voltage transmitted by the first voltage converting circuit Buck1 into an approximately 1.25V voltage and subsequently output the voltage to the first driving chips Q1. The third voltage converting circuit Buck3 may convert the 5V voltage transmitted by the first voltage converting circuit Buck1 into an approximately 1.1V voltage and an approximately 1.8V voltage and subsequently output the voltages into the time schedule controller TCON. The third voltage converting circuit Buck3 may further convert the 5V voltage transmitted by the first voltage converting circuit Buck1 into an approximately 3.3V voltage and subsequently output the voltage to the first driving chips Q1.

In an exemplary embodiment, the power-supply managing chip PMIC is further electrically connected to the first driving chips Q1, and is configured for providing the first driving chips Q1 other power-supply voltage signals that they require. For example, the power-supply managing chip PMIC is further electrically connected to the first driving chips Q1, and is configured for providing a VSN signal and a VSP signal. Both of the VSN signal and the VSP signal are liquid-crystal driving power-supply voltages, i.e., power-supply voltages for charging the storage capacitors in the sub-pixels, wherein one of them is a positive voltage, and the other is a negative voltage.

As an example, the two first electric-power supplying modules Display P share the first power-supply interface JK1 of the main circuit board M PCBA, and the structures of the two first electric-power supplying modules Display P are completely the same.

Figure 4:
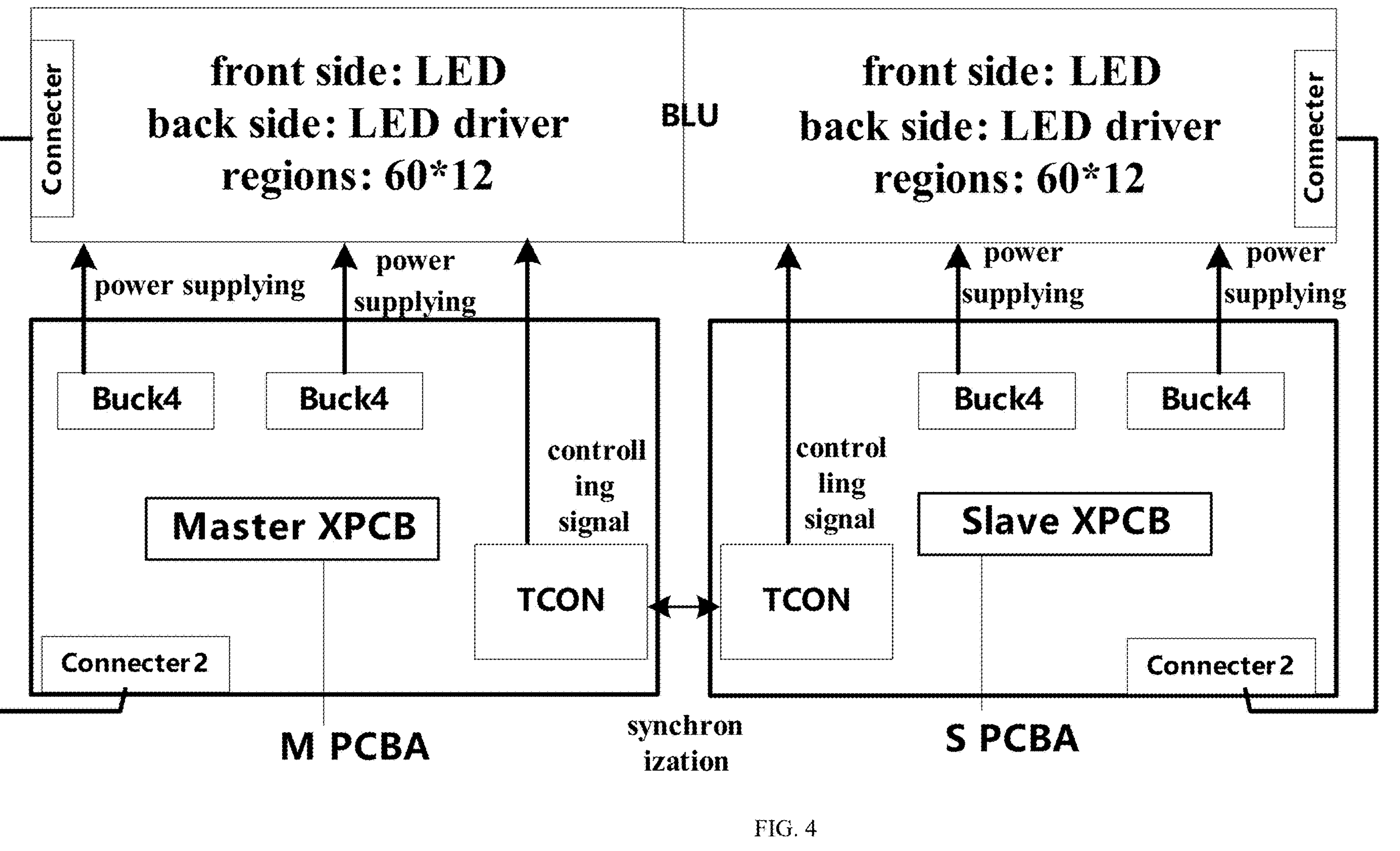
FIG. 4 is a schematic diagram of the electric-power-supplying process of a backlight module in a displaying device according to an embodiment of the present application.

In at least one embodiment of the present application, referring to FIGS. 3 and 4, the second electric-power supplying module BLU P comprises a second connector Connecter2 and two fourth voltage converting circuits Buck4. The second connector Connecter2 is electrically connected to the lamp board DB, and each of the fourth voltage converting circuits Buck4 is electrically connected to the second power-supply interface JK2 and the second connector Connecter2. The backlight module BLU comprises two lamp boards DB (as shown in FIG. 4, two lamp boards DB are spliced together to form the backlight module BLU). The two fourth voltage converting circuits Buck4 in the same one second electric-power supplying module BLU P are configured for supplying electric power to the same one lamp board DB.

In an exemplary embodiment, the backlight module BLU comprises two lamp boards DB, the second electric-power supplying module BLU P of the main circuit board M PCBA supplies electric power to one of the lamp boards DB, and the second electric-power supplying module BLU P of the secondary circuit board S PCBA supplies electric power to the other of the lamp boards DB.

As an example, the structures of the two second electric-power supplying modules BLU P are completely the same.

As an example, the first connector Connecter1 may comprise 40 leads (Pin).

As an example, the second connector Connecter2 may comprise 80 leads (Pin). In this case, the connectors that are provided on the lamp boards DB and connected to the second connector Connecter2 also have 80 leads.

In at least one embodiment of the present application, as shown in FIGS. 1, 2 and 3, the displaying device further comprises at least two third connectors Connecter3, each of the third connectors Connecter3 is electrically connected to the main circuit board M PCBA and the secondary circuit board S PCBA, the first electric-power supplying module Display P of the secondary circuit board S PCBA is electrically connected to the first power-supply interface JK1 by the third connector Connecter3, and the time schedule controller TCON of the main circuit board M PCBA and the time schedule controller TCON of the secondary circuit board S PCBA are electrically connected by the third connector Connecter3.

In an exemplary embodiment, referring to FIGS. 3 and 4, the time schedule controller TCON of the main circuit board M PCBA and the time schedule controller TCON of the secondary circuit board S PCBA may be communicatively connected via a SPI interface, to realize the signal synchronization. The SPI interface is the abbreviation of Serial Peripheral Interface, is a high-speed and synchronized communication bus, and occupies merely four lines in the base pins of the chip (for example, a TCON chip), which saves the base pins of the chip, and saves the design room of the first circuit boards D1 (the main circuit board M PCBA or the secondary circuit board S PCBA).

In an exemplary embodiment, the displaying device comprises two groups of the third connectors Connecter3, and each of the groups comprises two third connectors Connecter3. In other words, in each of the main circuit board M PCBA and the secondary circuit board S PCBA two third connectors Connecter3 are provided, to realize the communicative connection and the signal synchronization of multiple types of signals in the main circuit board M PCBA and the secondary circuit board S PCBA.

As an example, the signals that are required to be synchronized in the time schedule controller TCON of the main circuit board M PCBA and the time schedule controller TCON of the secondary circuit board S PCBA include but are not limited to enabling signal EN and vertical synchronization signal VSync (Vertical Synchronization), wherein the vertical synchronization signal is also referred to as a field synchronization signal.

The enabling signal EN (Enable) is used for controlling at least some of the light regions of the lamp boards DB to enter the on-state. The vertical synchronization signal VSync is used for synchronizing the FPS (Frames Per Second, or the quantity of the frames transmitted per second) with the refresh rate of the display panel. The time schedule controller TCON of the main circuit board M PCBA is electrically connected to the display panel and one of the lamp boards DB, the time schedule controller TCON of the secondary circuit board S PCBA is electrically connected to the display panel and the other of the lamp boards DB, and the two time schedule controllers TCON transmit the same vertical synchronization signal VSync to the two lamp boards DB, thereby synchronizing the displaying signal of the display panel and the controlling signal of the lamp boards DB.

Besides the enabling signal and the field synchronization signal, some other data signals and clock signals are required to be synchronized, to ensure the synchronization of the displaying signal of the display panel. The relevant explanation on the synchronization of the data signals and the clock signals may refer to the description in the related art, and is not discussed further herein.

In at least one embodiment of the present application, as shown in FIG. 4, the lamp board DB is electrically connected to the second connector Connecter2.

As shown in FIG. 22, each of the two lamp boards DB comprises:

- a base board 400;
- a plurality of light regions that are located on one side of the base board 400 and are arranged in an array, wherein each of the light regions contains at least one light emitting device 401; and
- a plurality of minisized chips 402 (Micro IC) located on the side of the base board 400 that is farther from the light emitting device 401, wherein each of the minisized chips 402 is electrically connected to the light emitting device 401 within one light region. All of the minisized chips 402 in the same one lamp board DB are electrically connected to the same one time schedule controller TCON by the second connector Connecter2 and the flexible circuit board FPC, and the time schedule controller TCON is configured for, by using the minisized chips 402, controlling the light regions of the lamp board DB to emit light in a region-division mode.

The material of the base board of the lamp board DB is not limited herein. As an example, the base board may be a rigid base board, the material of the rigid base board may be any one of glass, quartz, PET and plastic, and the thickness of the rigid base board may be 0.2 mm-1 mm. As an example, the thickness of the rigid base board is 0.2 mm, 0.4 mm, 0.5 mm, 0.7 mm or 1 mm.

As an example, one light region may contain 1 light emitting device 401, 4 light emitting devices 401, 6 light emitting devices 401 or 9 light emitting devices 401. All of the light emitting devices 401 within one light region are configured for being simultaneously driven to emit light; in other words, the quantity of the light regions is equal to the quantity of the minisized chips 402 (Micro IC).

All of the lamp boards DB according to the embodiments of the present application are described by taking the case as an example in which each of the light regions contains one light emitting device 401.

As an example, the backlight module according to the embodiments of the present application may have 1440 light regions; in other words, each of the lamp boards DB has 720 light regions.

The light emitting device 401 may be a Mini Light Emitting Diode (abbreviated as Mini LED) or a Micro Light Emitting Diode (abbreviated as Micro LED), which is not limited herein.

It should be noted that the lamp boards DB according to the embodiments of the present application employ the process of double-face component provision. The light regions are provided on one side of the base board, the minisized chips 402 (Micro IC) are provided on the other side of the base board, and each of the minisized chips 402 (Micro IC) passes through a through hole located in the base board and is electrically connected to the light emitting devices 401 within one of the light regions, to realize the driving controlling by the minisized chip 402 over all of the light emitting devices 401 within the one light region. The light emitting devices 401 in the lamp boards DB are controlled by using the plurality of minisized chips 402, thereby realizing the functions of region-division controlling, region-division light emission, region-division light regulation or region light regulation (the Local dimming function) of the light regions of the lamp boards DB.

It should also be noted that, as shown by the dotted-line arrow labeled as Local dimming in FIG. 2, the second connector Connecter2 electrically connects the time schedule controller TCON and the minisized chips 402 of the lamp board DB together, and the time schedule controller TCON is configured for transmitting a controlling signal of region-division light emission to the minisized chips 402 of the lamp board DB.

Figure 7:
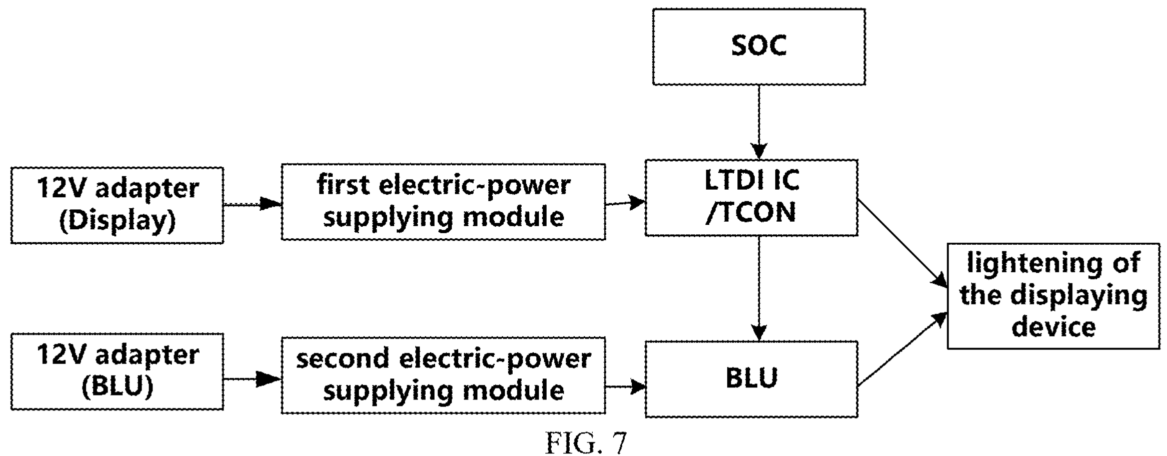
FIG. 7 is a diagram for illustrating the powering-on process of a displaying device according to an embodiment of the present application.

In an exemplary embodiment, as shown in FIG. 7, the power supply of the entire displaying device comprises two BLU power-supply interfaces (JK2) and one displaying power-supply interface (JK1), and the 3 interfaces are electrically connected to three 12V adapters. The displaying power-supply interface (JK1) is electrically connected to the first electric-power supplying module, and the BLU power-supply interfaces (JK2) are electrically connected to the second electric-power supplying module. When the first electric-power supplying module and the second electric-power supplying module are normally supplying electric power, the first driving chips (LTDI IC) and the time schedule controllers (TCON IC) normally operate. When the time schedule controllers TCON normally operate, they can provide the controlling signal to the minisized chips 402 (LED Driver) of the backlight module BLU, to drive the minisized chips 402 (LED Driver) to operate, so that the entire backlight module BLU are normally lightened. When LTDI IC and TCON IC are normally operating, the system chip SOC provides the signal to TCON for processing, and generates the ISP signals, which are transmitted to the first driving chips (LTDI IC), thereby realizing normal displaying of the frames.

In at least one embodiment of the present application, as shown in FIGS. 1, 2 and 3, all of the first driving chips Q1 include one main driving chip M IC and secondary driving chips S IC besides the main driving chip M IC, the main driving chip M IC is electrically connected to the main circuit board M PCBA, and all of the first driving chips Q1 are cascaded. Each of the secondary driving chips S IC is configured for transmitting the touch-controlling signal from the display panel to the main driving chip M IC, and the main driving chip M IC is configured for transmitting the touch-controlling signal to the system chip SOC.

As an example, the display panel comprises a plurality of touch-controlling electrodes and a plurality of touch-controlling lines TX. The touch-controlling electrodes can collect the touch-controlling signal of the user, and transmit the touch-controlling information into the first driving chips Q1 via the touch-controlling lines TX, wherein each of the first driving chips Q1 may be electrically connected to a plurality of touch-controlling lines TX. After the main driving chip M IC has received the touch-controlling information, the main driving chip M IC transmits the touch-controlling information into the system chip SOC via the traces in the main circuit board M PCBA. After any one of the secondary driving chips S IC has received the touch-controlling information, because all of the first driving chips Q1 are cascaded (for example, cascaded by the third connectors Connecter3), that secondary driving chip S IC transmits the received touch-controlling information to the main driving chip M IC, and the main driving chip M IC transmits the touch-controlling information into the system chip SOC via the traces in the main circuit board M PCBA. Subsequently the system chip SOC, according to the collected touch-controlling signal, by using the user interface, realizes a good human-machine interaction.

In the embodiments of the present application, by configuring that all of the first driving chips Q1 are cascaded, each of the secondary driving chips S IC is configured for transmitting the touch-controlling signal from the display panel to the main driving chip M IC, and the main driving chip M IC is configured for transmitting the touch-controlling signal to the system chip SOC, all of the pieces of the touch-controlling information are transmitted from the main driving chip M IC the system chip SOC, which can simplify the design of the connecting traces between the first driving chips Q1 and the system chip SOC to a large extent, release the design room of the main circuit board M PCBA and the secondary circuit board S PCBA, and simplify the design of the leads on the secondary driving chips S IC, thereby realizing the design of the touch-controlling driving of large-sized displaying devices, solving the problem in the driving designing when the first driving chips have a high quantity, reducing the difficulty in the driving designing, and reducing the difficulty in the fabrication.

In at least one embodiment of the present application, as shown in FIGS. 1, 2 and 3, the display panel comprises a first shift-register module GOA1 and a second shift-register module GOA2 that are located on the two sides of a displaying region AA. The main driving chip M IC is configured for controlling to transmit a shift-registering signal (for example, GOA signal) to the first shift-register module GOA1 and the second shift-register module GOA2.

In an exemplary embodiment, the shift-register module GOA (Gate on Array) is a technique in which the gate driving circuit is integrated in the array base board of the display panel, which can omit the Gate IC, reduce the border frame on the left side and the right side of the display panel, improve the aesthetic degree of the display panel, and reduce the cost.

As an example, the shift-registering signal (for example, GOA signal) includes but is not limited to clock signal (CLK signal) and frame synchronization signal (STV signal and STV0 signal).

In the related art, the time schedule controllers TCON in the circuit boards control to transmit the shift-registering signal to the shift-register module. When the displaying device has a large size, the display panel is electrically connected to driving chips of a high quantity, and the circuit boards electrically connected to the display panel have complicated designs, especially in display products having the touch-controlling function, the driving load and the difficulty in the driving designing of the circuit boards are very high, and it is difficult to balance multiple functions.

In the present application, by configuring that the main driving chip M IC controls to transmit the shift-registering signal (for example, GOA signal) to the first shift-register module GOA1 and the second shift-register module GOA2, that can simplify the driving designing in the circuit boards to a large extent, and reduce the driving loads of the time schedule controllers TCON and the circuit boards (the main circuit board M PCBA or the secondary circuit board S PCBA), thereby facilitating to realize the normal driving of large-sized touch-controlled display products, whereby the displaying devices cannot only balance multiple performances (touch controlling, a high resolution, a high contrast, a large size and so on), but also have reduced difficulty in design and fabrication cost.

In at least one embodiment of the present application, as shown in FIGS. 1, 2 and 3, the main circuit board M PCBA comprises a first converting unit Level shifter1, the secondary circuit board S PCBA comprises a second converting unit Level shifter2, the first converting unit Level shifter1 is electrically connected to the main driving chip M PCBA and the first shift-register module GOA1, and the second converting unit Level shifter2 is electrically connected to the main driving chip M PCBA and the second shift-register module GOA2. The first converting unit Level shifter1 and the second converting unit Level shifter2 are configured for, under the controlling by the main driving chip M PCBA, generating the shift-registering signal (GOA signal).

In an exemplary embodiment, as shown in FIG. 6, the main driving chip M IC is configured for generating the initial registering signal, including clock signals CLK IN1-10, a frame synchronization signal (STV signal and STV0 signal), and a VDDO signal.

The main driving chip M IC transmits the initial registering signal to the first converting unit Level shifter1 and the second converting unit Level shifter2. The first converting unit Level shifter1 and the second converting unit Level shifter2 are configured for performing level conversion to the initial registering signal, thereby obtaining the GOA signals required by the shift-register modules.

As an example, the first converting unit Level shifter1 and the second converting unit Level shifter2 perform level conversion to the initial registering signal, which can generate the shift-registering signal, including clock signals CLK IN1-10, a frame synchronization signal (STV signal and STV0 signal), a VDDO signal and a VDDE signal. The amplitudes of the initial registering signal and the shift-registering signal are unequal. The VDDO (VDD ODD) signal and the VDDE (VDD EVEN) signal are two different VDD signals (power-supply signals).

As an example, the main driving chip M IC may provide a high-level initial registering signal of a voltage of 3.3V and a low-level initial registering signal of a voltage of 0V. After an electrical-level converting module Level shifter has performed level conversion to the initial registering signals, they can match the voltage demands of the GOA signals required by the shift-register modules, thereby facilitating the normal driving of the shift-register modules.

The electrical-level converting module Level shifter is mainly used in the technique of multiple-power-source and multiple-voltage (MSMV). It usually does not have logic functions, and is merely used for the conversion between the signal levels of the power-supply areas (Voltage Area) of different voltage values.

The particular circuit structures of the first converting unit Level shifter1 and the second converting unit Level shifter2 are not limited herein, and all of electrical-level converting modules that can satisfy the functions to be realized according to the embodiments of the present application fall within the protection scope of the present application.

As an example, it may be configured that the circuit structures of the first converting unit Level shifter1 and the second converting unit Level shifter2 are the same.

In the embodiments of the present application, by providing the two electrical-level converting modules Level shifter and the two shift-register modules, simultaneously when the main driving chip M IC transmits the initial registering signal to the first converting unit Level shifter1 of the main circuit board M PCBA, the main driving chip M IC transmits the initial registering signal to the second converting unit Level shifter2 of the secondary circuit board S PCBA via the third connectors Connecter3 and FPC, the first converting unit Level shifter1 processes the initial registering signal and subsequently outputs the shift-registering signal to the first shift-register module GOA1, and the second converting unit Level shifter2 processes the initial registering signal and subsequently outputs the shift-registering signal to the second shift-register module GOA2, thereby realizing the double-side driving to the display panel.

In at least one embodiment of the present application, as shown in FIGS. 1-3, the minimum distance between the first converting unit Level shifter1 and the first shift-register module GOA1 and the minimum distance between the second converting unit Level shifter2 and the second shift-register module GOA2 are substantially equal.

In the embodiments of the present application, by providing the electrical-level converting module Level shifter at both of the main circuit board M PCBA and the secondary circuit board S PCBA, whereby the minimum distance between the first converting unit Level shifter1 and the first shift-register module GOA1 and the minimum distance between the second converting unit Level shifter2 and the second shift-register module GOA2 are substantially equal, that can reduce the impedance difference between the shift-registering signal transmitted from the first converting unit Level shifter1 to the first shift-register module GOA1 and the shift-registering signal transmitted from the second converting unit Level shifter2 to the second shift-register module GOA2 to a large extent, to reduce the voltage-drop difference (IR Drop difference), so that the shift-registering signals that are received by the first shift-register module GOA1 and the second shift-register module GOA2 are synchronized to the largest extent, thereby improving the effect of displaying of the displaying device.

In at least one embodiment of the present application, as shown in FIGS. 2, 3 and 6, the main circuit board M P (BA further comprises a converting module SW, and the converting module SW is electrically connected to the main driving chip M IC and the power-supply managing chip PMIC of the main circuit board M PCBA. The converting module SW is electrically connected to the first converting unit Level shifter1 and the second converting unit Level shifter2. The main driving chip M IC is configured for controlling the converting module SW to be switched between a displaying stage and a touch-controlling stage.

At the touch-controlling stage, as in the path shown by the dotted-line arrow in FIG. 6, the converting module SW is configured for being capable of receiving a modulating signal VMD transmitted by the main driving chip M IC and a first level signal (for example, including VGH-P and VGL-P) transmitted by the power-supply managing chip PMIC, superposing the first level signal and the modulating signal, and subsequently outputting to the first converting unit Level shifter1 and the second converting unit Level shifter2.

At the displaying stage, the converting module SW is configured for being capable of receiving the first level signal transmitted by the power-supply managing chip PMIC, and transmitting the outputted signal to the first converting unit Level shifter1 and the second converting unit Level shifter2.

In an exemplary embodiment, at the touch-controlling stage, the enabling signal TP-EN outputted by the main driving chip M IC controls the converting module SW to be capable of receiving the modulating signal VMD from the main driving chip M IC. At the displaying stage, the enabling signal TP-EN outputted by the main driving chip M IC controls the converting module SW to be not capable of receiving the modulating signal VMD from the main driving chip M IC.

As an example, the first level signal may include two signals VGH-P and VGL-P. Taking the case as an example in which the signal outputted by the converting module SW is VGL-S, at the displaying stage, the enabling signal TP-EN outputted by the main driving chip M IC is a low level, and the converting module SW, under the controlling by the enabling signal TP-EN, is not capable of receiving the modulating signal VMD from the main driving chip M IC, in which case VGL-S=VGL-P. At the touch-controlling stage, the enabling signal TP-EN outputted by the main driving chip M IC is a high level, and the converting module SW, under the controlling by the enabling signal TP-EN, is capable of receiving the modulating signal VMD from the main driving chip M IC, in which case, by the effect of the converting module SW, the signal outputted by the converting module SW is superposed with the modulating signal VMD, to cause that VGL-S=VGL-P+VMD.

In the displaying device according to the embodiments of the present application, by configuring that the main circuit board M PCBA comprises the converting module SW, configuring that the converting module SW is electrically connected to the main driving chip M IC and the power-supply managing chip PMIC of the main circuit board M PCBA, and configuring that the converting module SW is electrically connected to the first converting unit Level shifter1 and the second converting unit Level shifter2, at the touch-controlling stage, the first converting unit Level shifter1 and the second converting unit Level shifter2, by using the signal obtained by the superposition of the received first level signal and modulating signal as the reference signal, generate the shift-registering signal and transmit the shift-registering signal into the first shift-register module GOA1 and the second shift-register module GOA2. At this point, the shift-registering signal carries the modulating signal, and, as the shift-register modules are electrically connected to the grid lines, the signals outputted by the shift-register modules into the grid lines also carry the modulating signal. That, at the touch-controlling stage, reduces the parasitic capacitance between the touch-controlling electrodes and the grid lines, thereby preventing interference by the parasitic capacitance to the signals in the touch-controlling electrodes, and improving the touch-controlling sensitivity of the displaying device.

Figure 8:
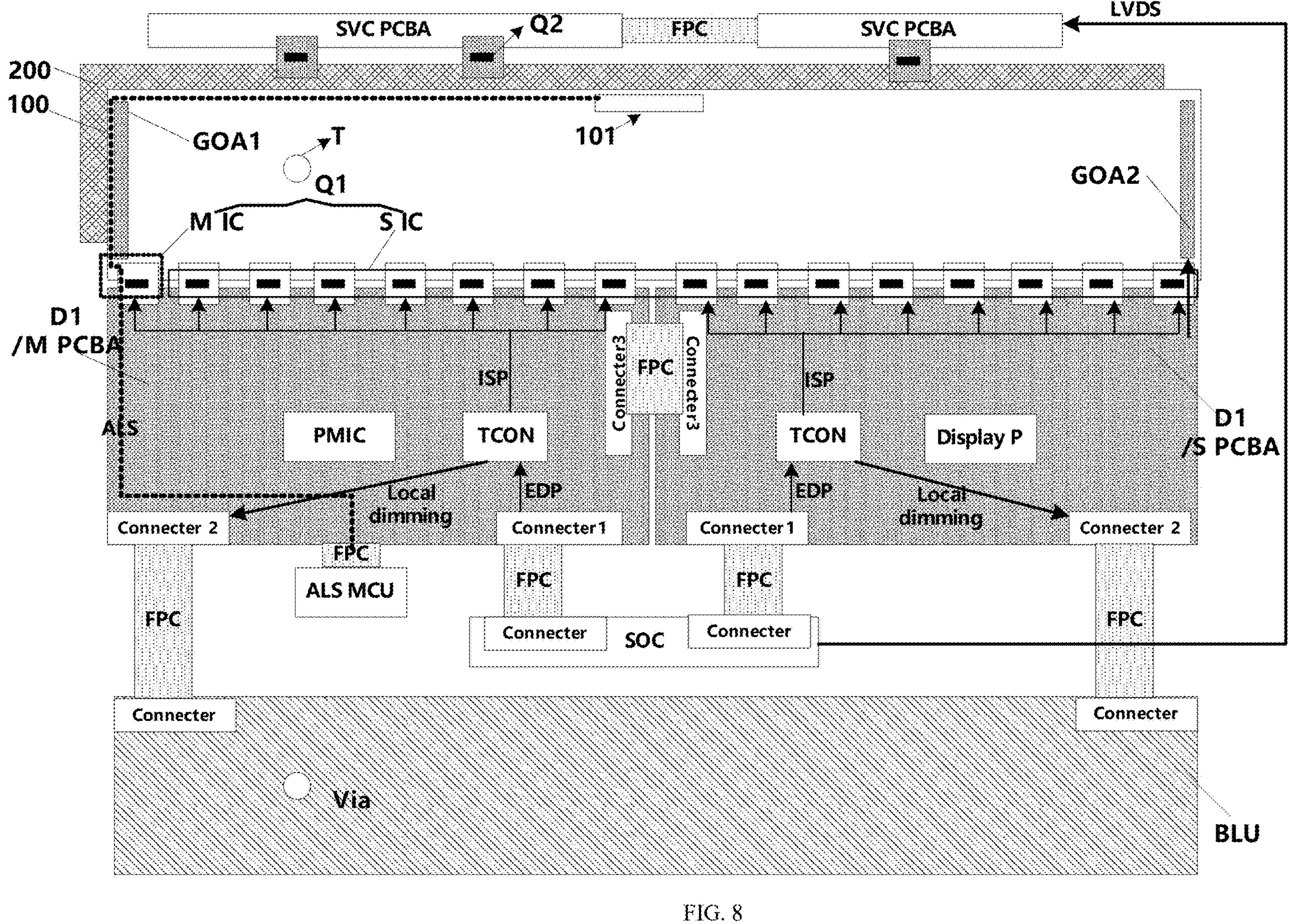
FIG. 8 is a schematic diagram of the driving architecture of another displaying device according to an embodiment of the present application.

In at least one embodiment of the present application, as shown in FIG. 8, the display panel comprises a light sensing sensor 101, and the displaying device further comprises a light-sensation processor ALS MCU (Ambient Light Sensor Microcontroller Unit). The light sensing sensor 101 is electrically connected to the light-sensation processor ALS MCU by the first circuit boards D1. The light-sensation processor ALS MCU is electrically connected to the time schedule controllers TCON.

Figure 9:
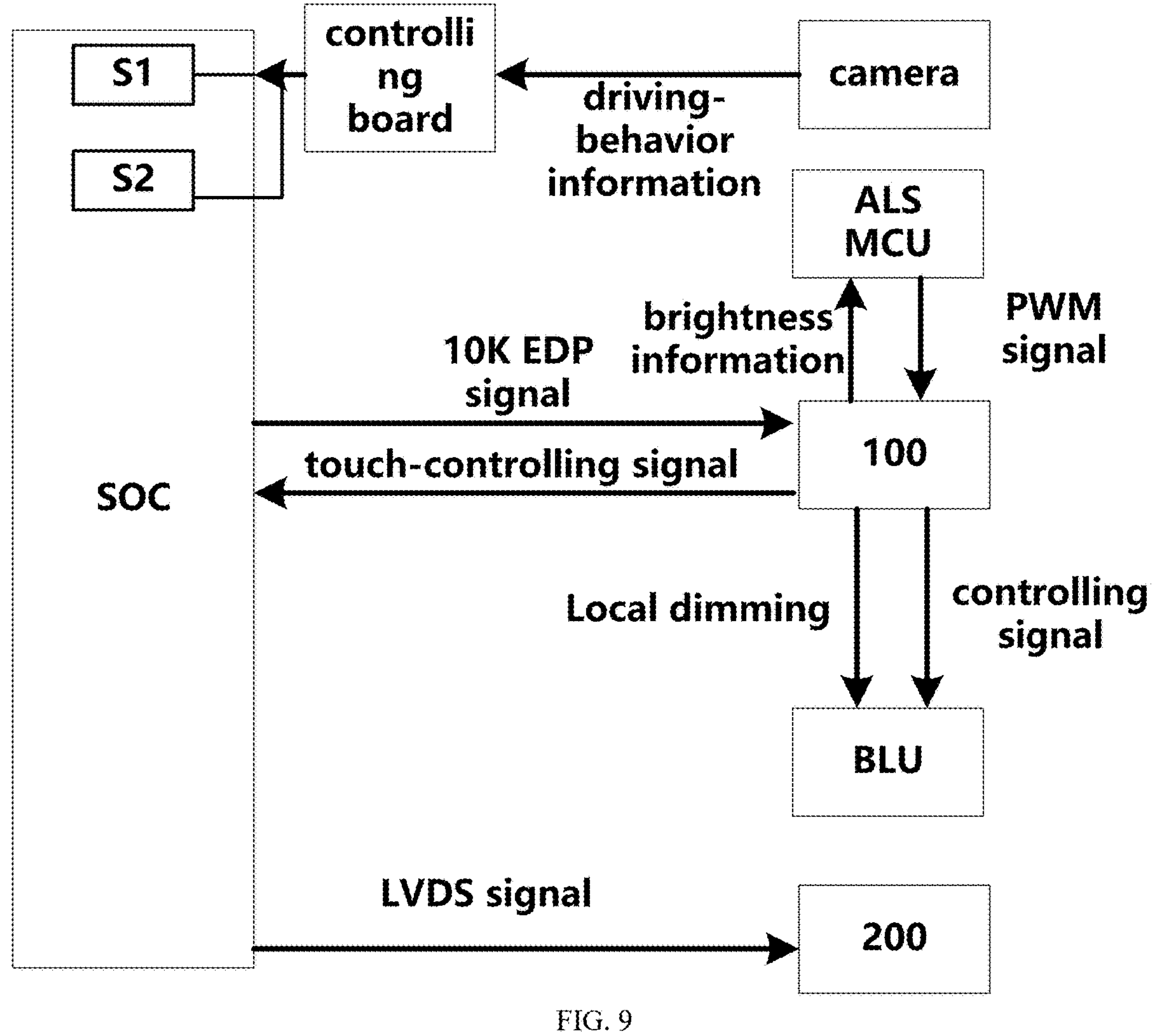
FIG. 9 is a schematic diagram of the signal transmission of a system chip in a displaying device according to an embodiment of the present application.

Referring to FIGS. 8 and 9, the light sensing sensor 101 is configured for converting a collected optical signal (carrying ambient-brightness information) into an electric signal and transmitting to the light-sensation processor ALS MCU. The light-sensation processor ALS MCU receives the electric signal, performs signal processing to the electric signal, and subsequently outputs a light regulating signal (PWM signal) to the time schedule controllers TCON. The time schedule controllers TCON generate controlling signals according to the light regulating signal (PWM signal) and transmit the controlling signals to the minisized chips 402.

In an exemplary embodiment, the light sensing sensor 101 may be provided within the peripheral region of the display panel 100, for example, provided on the side of the peripheral region that is farther from the first driving chips Q1.

As an example, the light sensing sensor 101 may comprise transistors, for example, thin-film transistors (TFT) or Metal-Oxide-Semiconductor Field Effect Transistors (MOSFET).

In some embodiments, as shown in FIG. 8, the light sensing sensor 101 may be electrically connected to the light-sensation processor ALS MCU by the main circuit board M PCBA, in which case the light-sensation processor ALS MCU and the main circuit board M PCBA are electrically connected together by connectors Connecter (not shown) and the flexible circuit board (FPC). Furthermore, the light-sensation processor ALS MCU is electrically connected to the time schedule controller TCON of the main circuit board M PCBA, and the time schedule controller TCON of the main circuit board M PCBA and the time schedule controller TCON of the secondary circuit board S PCBA perform the signal synchronization via the third connectors Connecter3.

In some other embodiments, the light sensing sensor 101 may be electrically connected to the light-sensation processor ALS MCU by the secondary circuit board S PCBA, in which case the light-sensation processor ALS MCU and the secondary circuit board S PCBA are electrically connected together by connectors Connecter (not shown) and the flexible circuit board (FPC). Furthermore, the light-sensation processor ALS MCU/is electrically connected to the time schedule controller TCON of the secondary circuit board S PCBA, and the time schedule controller TCON of the secondary circuit board S PCBA and the time schedule controller TCON of the main circuit board M PCBA perform the signal synchronization via the third connectors Connecter3.

Referring to FIGS. 8 and 9, the optical signal collected by the light sensing sensor 101 carries ambient-brightness information, and the electric signal received by the light-sensation processor ALS MCU also carries ambient-brightness information. The light-sensation processor ALS MCU receives the electric signal, performs signal processing to the electric signal, and subsequently outputs a light regulating signal (PWM signal) to the time schedule controllers TCON. The light regulating signal contains a Pulse Width Modulation (PWM) signal, the pulse width modulation signal can feed back with a duty-cycle signal, the time schedule controllers TCON, according to the pulse width modulation signal (or duty-cycle signal), generate the controlling signal, and, by using the minisized chips 402 of the backlight module, control the backlight brightness of the backlight module to be a percentage of the original brightness.

In the embodiments of the present application, by configuring that the display panel comprises a light sensing sensor 101, the displaying device further comprises the light-sensation processor ALS MCU, the light sensing sensor 101 is electrically connected to the light-sensation processor ALS MCU/by the first circuit boards D1, and the light-sensation processor ALS MCU is electrically connected to the time schedule controllers TCON, the displaying device can automatically regulate the brightness of the backlight module according to the brightness of the ambient light, which can reduce the power consumption of the displaying device, and improve the visual experience of the user.

Figure 10:
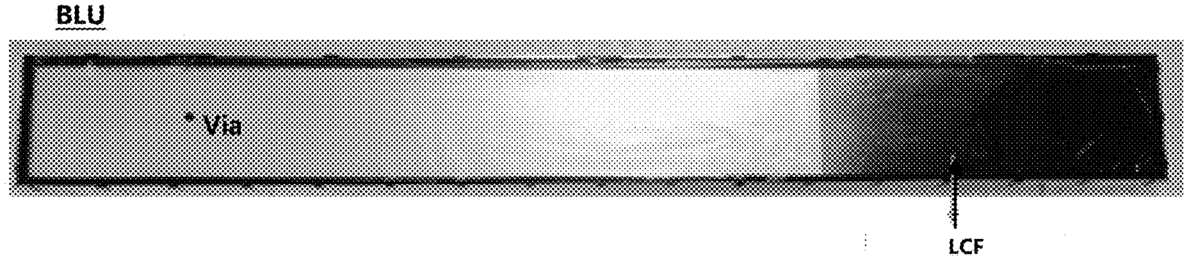
FIG. 10 is a schematic structural diagram of a backlight module according to an embodiment of the present application.

In at least one embodiment of the present application, as shown in FIG. 8, the displaying device further comprises a visual-angle controlling panel 200 and a privacy film LCF, and the visual-angle controlling panel 200 is located between the backlight module BLU and the display panel 100. As shown in FIG. 10, the privacy film LCF covers at least part of the region of the light-exiting face of the backlight module BLU.

As shown in FIG. 8, the displaying device further comprises at least two second driving-chip groups and at least two second circuit boards SVC PCBA, each of the second driving-chip groups comprises at least one second driving chip Q2, all of the second driving chips Q2 are electrically connected to the visual-angle controlling panel 200, each of the second driving-chip groups is electrically connected to one second circuit board SVC PCBA, the second circuit boards SVC PCBA are cascaded to each other by connectors to realize the synchronization of at least some of the signals, one second circuit board SVC PCBA is electrically connected to the system chip SOC, and the system chip SOC is configured for transmitting an image signal (for example, an LVDS signal) to the second circuit board SVC PCBA.

In an exemplary embodiment, the visual-angle controlling panel 200 may be a liquid-crystal display panel (LCD display panel). The LCD display panel may include but are not limited to liquid-crystal display panels such as the TN (Twisted Nematic) type, the VA (Vertical Alignment) type, the IPS (In-Plane Switching) type and the ADS (Advanced Super Dimension Switch) type.

As an example, the visual-angle controlling panel 200 comprises an array base board and a color-film base board. The structure of the array base board may refer to the structures of array base boards of LCD display panels in the related art. The color-film base board herein is not provided with a color-film pattern (the visual-angle controlling panel 200 is not used for realizing color displaying), and is merely provided with a black-matrix pattern, so as to, when implementing the pixel-level peeping-prevention function, block the light rays emitted by the neighboring pixel units, to prevent interference on the dark-state pixel units by the light rays of the bright-state pixel units.

In an exemplary embodiment, the visual-angle controlling panel 200 may not be provided with a color light filtering layer (Color Filter, CF). For example, the visual-angle controlling panel 200 may not be provided with a color-film pattern, and not be provided with a black-matrix pattern.

The visual-angle controlling panel 200 may also be referred to as an SVC (Smart View Control, or intelligent visual-angle light regulation) panel.

In an exemplary embodiment, that the privacy film LCF covers at least part of the region of the light-exiting face of the backlight module BLU includes but is not limited to the following cases:

Firstly, the privacy film LCF covers part of the region of the light-exiting face of the backlight module BLU.

Secondly, the privacy film LCF covers the whole of the region of the light-exiting face of the backlight module BLU.

In practical applications, within the region where the privacy film LCF is located, the light rays exiting the backlight module BLU are a collimated-light source. The collimated-light source may be understood as a light source that has a high brightness at the direct visual angle and a very low brightness at side visual angles (squint angles). Accordingly, the effect can be realized that at the direct visual angle the displayed frame is visible and at side visual angles the displayed frame prevents peeping.

By providing the visual-angle controlling panel 200 between the backlight module BLU and the display panel 100, when the visual-angle controlling panel 200 is displaying a white frame, the collimated-light source is dispersed, the displaying device is switched into a frame-sharing state. When the visual-angle controlling panel 200 is displaying a black frame, the collimated-light source exits within the region where the privacy film LCF is provided, whereby the region where the privacy film LCF is provided realizes the peeping prevention of the displayed frame.

Both of the second driving-chip groups and the second circuit boards are components that are used for driving the visual-angle controlling panel 200 and are bonded to the visual-angle controlling panel 200. In practical applications, in order to prevent interference in the signal or in the design room between the first driving-chip groups and the first circuit boards D1 for driving the display panel 100 and the second driving-chip groups and the second circuit boards for driving the visual-angle controlling panel 200, the components for driving the visual-angle controlling panel 200 (the second driving-chip groups and the second circuit boards) and the components for driving the display panel 100 (the first driving-chip groups and the second circuit boards) may be provided on different lateral sides of the displaying device. For example, as shown in FIG. 8, they are provided on the upper side and the lower side of the display side of the displaying device.

As long as the driving chips can realize the functions required by the embodiments of the present application, it is not limited herein whether the structures and the types of the second driving chips and the first driving chips are the same, which may be decided particularly according to practical requirements on the process and the cost.

It should be noted that, referring to FIGS. 8 and 9, the system chip SOC is configured for transmitting an image signal to the second circuit boards SVC PCBA. In order to distinguish from the video signal transmitted by the system chip SOC to the first circuit boards D1, the signal transmitted by the system chip SOC to the second circuit boards is referred to as an image signal.

As an example, the image signal herein also may transmit video information. The difference between the signals transmitted by the system chip SOC to the first circuit boards D1 and the second circuit boards is as follows. The display panel connected to the first circuit boards D1 requires implementing the function of displaying the frames, and it has higher requirements on the bandwidth and the signal quantity of the signals that it transmits than those of the visual-angle controlling panel 200 connected to the second circuit boards. The visual-angle controlling panel 200 is mainly used for implementing the functions of the dispersion of the collimated light rays or the transmission of the collimated light rays. Therefore, the signal transmitted by the system chip SOC to the first circuit boards D1 is transmitted by using an EDP-type interface signal, and the signal transmitted by the system chip SOC to the second circuit boards is transmitted by using an LVDS-type interface signal. That, while satisfying the performance requirements of the displaying device, can reduce the difficulty in design of the displaying device and reduce the load of the system chip SOC to a large extent.

In at least one embodiment of the present application, the displaying device further comprises a camera. As shown in FIG. 8, the backlight module is provided with a mounting hole Via, and the camera (not shown) is provided in the mounting hole Via. Each of the display panel 100 and the visual-angle controlling panel 200 is provided with a light transmitting region T, and the orthographic projections of the light transmitting regions T on the camera cover the camera. The displaying device further comprises a controlling board (not shown), and the controlling board is electrically connected to the camera and the system chip.

It should be noted that the backlight module BLU shown in FIG. 8, in practical applications, is flipped to the side of the visual-angle controlling panel 200 that is farther from the display panel 100. Here, in order to facilitate to describe the structures and the electric-connection relation, the backlight module BLU is drawn on the lower side of the display panel 100.

In at least one embodiment of the present application, as shown in FIG. 9, the system chip SOC comprises a hand-gesture identifying module S1, and the hand-gesture identifying module S1 is electrically connected to the controlling board.

The camera is configured for collecting hand-gesture-action information of a driving person, and transmitting the hand-gesture-action information to the controlling board, and the controlling board is configured for receiving the hand-gesture-action information and feeding back the hand-gesture-action information into the hand-gesture identifying module S1. The hand-gesture identifying module S1 is configured for storing a predetermined relation between the hand-gesture-action information and an instruction signal, determining the instruction signal according to the hand-gesture-action information, and, according to the instruction signal, controlling the display panel 100 to execute a corresponding operation.

In an exemplary embodiment, the camera collects the video or the image of the driving person, wherein the video or the image contains the hand-gesture-action information, and the hand-gesture identifying module S1 may, from the video or the image, identify the action paths of the ten fingers and the hand-gesture action of the user, identify the targets of the ten fingers, and convert the identification information into instruction information in real time.

As an example, the hand-gesture action of the driving person may include stretching of the five fingers, shaking of a palm, sliding of a finger, sliding of a gripping fist, and so on.

For example, the driving person may regulate the volume of an audio device by sliding of a gripping fist.

In at least one embodiment of the present application, as shown in FIG. 9, the system chip SOC comprises a driving-person monitoring module S2, and the driving-person monitoring module S2 is electrically connected to the controlling board.

The camera is configured for monitoring the driving behavior of a driving person, and transmitting driving-behavior information to the controlling board. The controlling board is configured for receiving the driving-behavior information and feeding back the driving-behavior information to the driving-person monitoring module S2. The driving-person monitoring module S2 is configured for receiving the driving-behavior information and, according to the driving-behavior information, transmitting a video signal having a prompting message to the display panel.

In an exemplary embodiment, the driving-person monitoring module S2 may also be referred to as a DMS (Driver Monitoring System) module. The particular structure and the driving designing of the DMS module may refer to the description on DMS in the related art, and are not discussed further herein.

As an example, the monitored driving behavior of the driving person may include not tying a safety belt, yawning, telephoning, nodding and so on.

It should be noted that, while the display panel is displaying the video signal having the prompting message, the displaying device may emit a prompting voice.

In the embodiments of the present application, by providing the hand-gesture identifying module S1 and the driving-person monitoring module S2, when the displaying device is applied in a travelling tool, the displaying device can monitor in real time the driving behavior of the driving person, and timely feed back into the system chip SOC, and the system chip SOC makes the corresponding feedback, which can improve the safety of the driving and improve the usage experience of the user to a large extent.

In at least one embodiment of the present application, the display panel comprises a touch-controlling layer. As shown in FIG. 13, the touch-controlling layer Touch Layer comprises a plurality of touch-controlling electrodes and a hollowed-out part LK, the orthographic projections of the touch-controlling electrodes on a substrate of the display panel are within a region outside the light transmitting region T, and the orthographic projection of the hollowed-out part LK on the substrate of the display panel is within the light transmitting region T.

In at least one embodiment of the present application, as shown in FIG. 13, the touch-controlling electrodes include a plurality of first touch-controlling electrodes TS1 and a plurality of second touch-controlling electrodes TS2 (not shown in FIG. 13), the plurality of first touch-controlling electrodes TS1 surround the hollowed-out part LK, the minimum distance between the first touch-controlling electrodes TS1 and the edge of the hollowed-out part LK is less than the planar dimension of each of the second touch-controlling electrodes TS2, and the area of the planar pattern of each of the first touch-controlling electrodes TS1 is 107%-110% of the area of the planar pattern of each of the second touch-controlling electrodes TS2.

In an exemplary embodiment, in order to facilitate the installation of the camera, the hollowed-out part LK is provided in the touch-controlling layer to avoid the region where the camera is provided, to prevent the touch-controlling layer from reducing the quantity of the light rays entering the camera.

In the practical design, the design of the touch-controlling electrodes in the touch-controlling layer also requires avoiding the position of the hollowed-out part LK. In some embodiments, the quantity of the touch-controlling electrodes may be reduced, by omitting the touch-controlling electrodes that were originally provided at the position of the hollowed-out part LK, and the sizes and the arrangement of the touch-controlling electrodes around the position of the hollowed-out part LK are correspondingly adjusted, whereby the touch-controlling electrodes within the region of the touch-controlling layer that does not overlap with the light transmitting region are evenly arranged. Therefore, the displaying light rays within the region outside the light transmitting region in the display panel can be even to the largest extent, which, while ensuring that the camera normally operates and the touch-controlling function is normally implemented, increases the uniformity of the brightness of the display panel.

It should be noted that the display panel does not have the touch-controlling function at the position corresponding to the hollowed-out part LK (the position of the light transmitting region).

In an exemplary embodiment, the minimum distance between the first touch-controlling electrodes TS1 and the edge of the hollowed-out part LK is less than the planar dimension of each of the second touch-controlling electrodes TS2. The planar dimension of the second touch-controlling electrode TS2 may refer to the dimension in the direction along the displaying region pointing to the bonding region (the region where the first driving chips Q1 are provided). Alternatively, the planar dimension of the second touch-controlling electrode TS2 may also be the dimension in the direction from the first shift-register module GOA1 pointing to the second shift-register module GOA2.

As an example, the area of the planar pattern of each of the first touch-controlling electrodes TS1 is 107%-110% of the area of the planar pattern of each of the second touch-controlling electrodes TS2. For example, the area of the planar pattern of each of the first touch-controlling electrodes TS1 is approximately 107%, 107.5%, 107.7%, 107.8%, 108%, 108.1%, 108.5%, 108.7%, 108.8%, 109.1%, 109.5%, 109.7% and 109.8% of the area of the planar pattern of each of the second touch-controlling electrodes TS2.

As an example, the areas of the planar patterns of the plurality of first touch-controlling electrodes TS1 are at least partially equal.

It should be noted that, because the hollowed-out part LK is provided, the distribution positions of the touch-controlling electrodes (Touch Sensor) have been adjusted, and the positions of the touch-controlling lines TX in the display panel 100 are also properly adjusted. However, the electric-connection relation between the touch-controlling electrodes and the touch-controlling lines is not changed.

Figure 14:
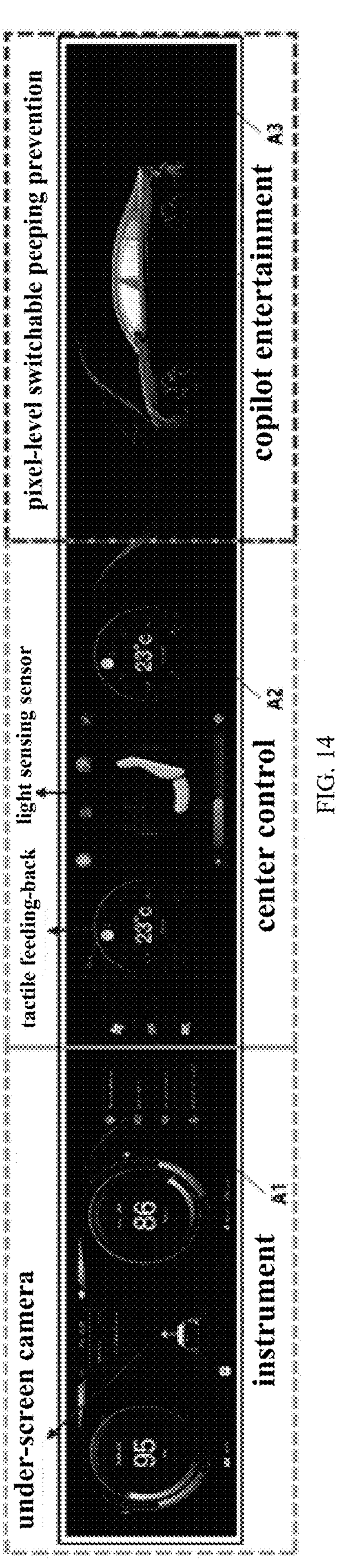
FIG. 14 is a schematic top structural diagram of a displaying device according to an embodiment of the present application.

In at least one embodiment of the present application, as shown in FIG. 14, the displaying device comprises an instrument-provision region A1, a center-control region A2 and an entertainment region A3, and the center-control region A2 is located between the instrument-provision region A1 and the entertainment region A3. The privacy film LCF is provided within the entertainment region A3.

In an exemplary embodiment, the planar pattern of the displaying device may be a rectangle. For example, the length-width ratio of the rectangle is approximately 10:1.

As an example, it may be configured that the left ⅓ region of the displaying device whose planar pattern is a rectangle is the instrument-provision region A1, the middle ⅓ region of the displaying device whose planar pattern is a rectangle is the center-control region A2, and the right ⅓ region of the displaying device whose planar pattern is a rectangle is the entertainment region A3.

As an example, the camera is located within the instrument-provision region A1 of the displaying device, for example, located at the center position of the instrument-provision region A1.

In the frame-sharing state, the time schedule controllers TCON are configured for controlling the brightnesses of the part of the light emitting devices 401 that are located within the entertainment region A3 to be greater than the brightnesses of the part of the light emitting devices 401 that are located within the instrument-provision region A1 and the center-control region A2, and the brightnesses of the instrument-provision region A1, the center-control region A2 and the entertainment region A3 of the displaying device to be equal.

In the displaying device according to the embodiments of the present application, because the privacy film LCF is provided at the part of the backlight module BLU that is located within the entertainment region A3, the privacy film LCF reduces the brightness of the light rays exiting the backlight source within the entertainment region A3, so that the brightness of the displaying device located within the entertainment region A3 is reduced. In the frame-sharing state, in order to cause the brightness of the displayed frame to be uniform, it may be configured, by using the function of region-division controlling over the backlight module, that the brightness of the part of the light emitting devices that are located within the entertainment region A3 is greater than the brightness of the part of the light emitting devices 401 that are located within the instrument-provision region A1 and the center-control region A2, so as to, by using the brightness difference of the light emitting devices 401, compensate for the loss of the brightness of the entertainment region A3 caused by the privacy film LCF, so that, in the final displayed frame of the displaying device, the brightnesses of the instrument-provision region A1, the center-control region A2 and the entertainment region A3 are equal, thereby improving the uniformity of the brightness of the displaying device in the frame-sharing state, and improving the effect of displaying.

As an example, the minisized chips 402 may be controlled by using the time schedule controllers TCON, whereby the minisized chips 402 located within the entertainment region A3 control the electric currents of the light emitting devices 401 to be higher, and the minisized chips 402 located within the instrument-provision region A1 and the center-control region A2 control the electric currents of the light emitting devices 401 to be lower.

As an example, the minisized chips 402 located within the entertainment region A3 control the electric currents of the light emitting devices 401 to be 30-34 mA, for example, 30 mA, 30.5 mA, 31 mA, 31.5 mA, 32 mA, 32.5 mA, 33 mA, 33.5 mA and 34 mA. The minisized chips 402 located within the instrument-provision region A1 and the center-control region A2 control the electric currents of the light emitting devices 401 to be 11-13 mA, for example, 11.5 mA, 12 mA, 12.5 mA and 13 mA.

In at least one embodiment of the present application, the image signal transmitted by the system chip SOC to the visual-angle controlling panel 200 comprises a white-frame image signal and a black-frame image signal.

As an example, the white-frame image signal corresponds to the displayed frame with the 255 grayscale, and the black-frame image signal corresponds to the displayed frame with the L0 grayscale.

As shown in FIG. 11, in the frame-sharing state, the system chip SOC is configured for transmitting the white-frame image signal into the visual-angle controlling panel 200.

As shown in FIG. 11, when the visual-angle controlling panel 200 is displaying a white frame (with the 255 grayscale, i.e., L255), the collimated-light source emitted by the backlight module BLU via the privacy film LCF is dispersed, and, from the side visual angles, the frame of the region of the displaying device that is located within the entertainment region A3 can be seen; in other words, from the main driving position (directly facing the instrument-provision region A1), the frame of the region of the displaying device that is located within the entertainment region A3 can be seen.

In at least one embodiment of the present application, the visual-angle controlling panel 200 comprises a plurality of first pixel units and a plurality of second pixel units besides the first pixel units, the orthographic projection of the privacy film LCF on the visual-angle controlling panel 200 covers the first pixel units, and the plurality of first pixel units are located within the entertainment region A3.

In a frame-peeping-prevention state, the system chip SOC is configured for transmitting the white-frame image signal into all of the second pixel units, and transmitting the black-frame image signal into at least some of the first pixel units.

In an exemplary embodiment, both of the regions of the visual-angle controlling panel 200 that are located outside the entertainment region A3 (the instrument-provision region A1 and the center-control region A2) are provided with the second pixel units, and the part of the visual-angle controlling panel 200 that is located within the entertainment region A3 is provided with the first pixel units. The privacy film LCF is provided within the entertainment region A3.

In practical applications, it may be configured that the part of the pixel units of the displaying device that are located within the entertainment region A3 realize the frame peeping prevention, and the part of the pixel units of the displaying device that are located within the entertainment region A3 realize the frame sharing.

All of the second pixel units transmit the white-frame image signal, some of the first pixel units transmit the white-frame image signal, and some of the first pixel units transmit the black-frame image signal. The light rays exiting the region where the pixel units transmitting the white-frame image signal are located in the visual-angle controlling panel 200 are non-collimated light rays, so that the displaying light rays exiting the displaying device can exit in the directions of the direct visual angle and the side visual angles, to realize the frame sharing of a local region. The light rays exiting the region where the pixel units transmitting the black-frame image signal are located in the visual-angle controlling panel 200 are collimated light rays, so that the displaying light rays exiting the displaying device can exit in the direction of the direct visual angle, to realize the frame peeping prevention of a local region. Accordingly, the pixel-level switching between the frame peeping prevention and the frame sharing in the displaying device can be realized.

Certainly, in practical applications, usually it is configured that merely the whole region of the entertainment region A3 can perform the switching between the frame peeping prevention and the frame sharing.

As shown in FIG. 12, the second instance of the driving-chip groups (the driving chip on the right) is electrically connected to the part of the visual-angle controlling panel 200 that is located within the entertainment region A3. In the frame-peeping-prevention state, the system chip SOC is configured for, by using the second instance of the driving-chip groups (the driving-chip group on the right), transmitting the black-frame image signal to the part of the visual-angle controlling panel 200 that is located within the entertainment region A3.

As an example, referring to FIGS. 8 and 12, the displaying device comprises two second driving-chip groups and two second circuit boards SVC PCBA, a first instance of the second driving-chip groups comprises two second driving chips Q2, and a second instance of the second driving-chip groups comprises one second driving chip Q2.

Figures 15, 16:
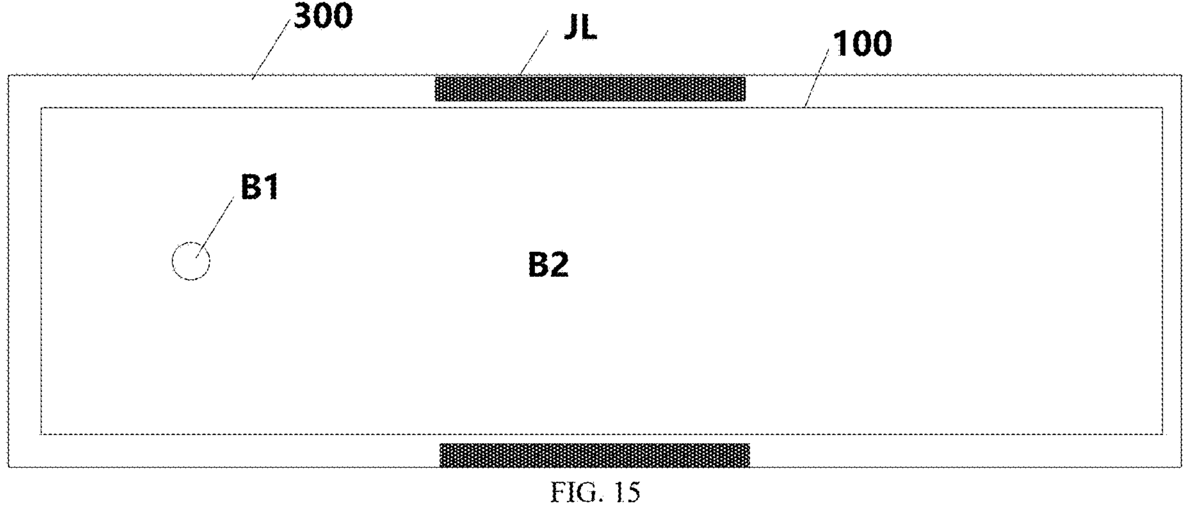
FIG. 15 is a schematic top structural diagram of a cover plate and a display panel according to an embodiment of the present application.
FIG. 16 is a schematic diagram of the visual-angle directions of a displaying device according to an embodiment of the present application.

In at least one embodiment of the present application, as shown in FIG. 15, the displaying device comprises a cover plate 300, the cover plate 300 covers the display panel 100, and the planar size of the cover plate 300 is greater than the planar size of the display panel 100.

As an example, the orthographic projection of the display panel 100 on the cover plate 300 is located within the edge of the cover plate 300.

In an exemplary embodiment, the part of the cover plate 300 that is located within the center-control region A2 is provided with at least two exciters JL, the two exciters JL are located on the side of the cover plate 300 that is closer to the backlight module BLU, and the two exciters JL are located on two opposite lateral sides of the cover plate 300. The exciters JL are electrically connected to the display panel 100, and the exciters JL are configured for vibrating after the display panel 100 has received a touch-controlling operation (also referred to as 3D tactile feedback), wherein the touch-controlling operation includes sliding and pressing.

As an example, each of the exciters JL may comprise a piezoelectric sheet.

As an example, the sliding may include sliding along a straight line and sliding along an arc line. The pressing may include long pressing and short pressing. The long pressing and the short pressing may be distinguished by using a critical duration, wherein a pressing with a pressing duration greater than or equal to the critical duration may be defined as the long pressing, and a pressing with a pressing duration less than the critical duration may be defined as the short pressing.

In the displaying device according to the embodiments of the present application, based on the touch-controlling function, the tactile-feeding-back function is added, which causes the touch-controlling operation to be more realistic and sensible. When the displaying device is applied in a travelling tool, the 3D tactile-feeding-back function facilitates the user to perform blind operations, which improves the driving safety and the user interaction experience.

In at least one embodiment of the present application, as shown in FIG. 15, the cover plate 300 comprises a first region B1 and a second region B2 besides the first region B1, and the orthographic projection of the camera on the cover plate 300 is within the first region B1. The cover plate 300 comprises a first surface, the first surface is closer to the display panel, a first printing-ink layer is provided at the part of the first surface that is located within the first region B1, a second printing-ink layer is provided at the part of the first surface that is located within the second region B2, the first printing-ink layer is configured for being capable of transmitting displaying light rays of the display panel 100, and the second printing-ink layer is configured for being capable of transmitting infrared light rays for the camera to capture information.

In an exemplary embodiment, the first printing-ink layer and the second printing-ink layer are provided on the first surface of the cover plate 300, which facilitates to realize the full-black effect in the dark state of the displaying device, to improve the aesthetic degree of the displaying device.

As an example, the material of the first printing-ink layer may comprise a black printing ink, and the material of the second printing-ink layer may comprise a dark-red printing ink or a blackish-red printing ink.

In at least one embodiment of the present application, the transmittance of the second printing-ink layer to infrared light rays is greater than or equal to 70%.

In at least one embodiment of the present application, the resolution of the visual-angle controlling panel 200 is ⅙-½ of the resolution of the display panel 100.

As an example, the resolution of the visual-angle controlling panel 200 is ⅕, ¼ or ⅓ of the resolution of the display panel 100.

In the embodiments of the present application, the inventor has found by testing that, by configuring that the resolution of the visual-angle controlling panel 200 is ⅙-½ of the resolution of the display panel 100, that can significantly reduce the sawteeth of the displayed frame in the displaying device, and improve the uniformity of the frame brightness of the displaying device, thereby improving the image quality, and improving the effect of displaying.

In at least one embodiment of the present application, in the frame-peeping-prevention state, the range of the ratio of the side-visual-angle brightness of the part of the displaying device that is located within the entertainment region A3 to the direct-visual-angle brightness of the part of the displaying device that is located within the entertainment region A3 is 0.3%-1%.

In the frame-sharing state, the range of the ratio of the side-visual-angle brightness of the part of the displaying device that is located within the entertainment region A3 to the direct-visual-angle brightness of the part of the displaying device that is located within the entertainment region A3 is 7%-12%.

In an exemplary embodiment, the direct visual angle refers to the visual angle when an human eye is located adjacent to the position labeled as 0° in FIG. 16, and the side visual angle refers to a visual angle when a human eye is obliquely watching the display side of the displaying device.

In an exemplary embodiment, as shown in FIG. 16, in the frame-peeping-prevention state, the range of the ratio of the 45° side-visual-angle brightness of the part of the displaying device that is located within the entertainment region A3 to the direct-visual-angle brightness of the part of the displaying device that is located within the entertainment region A3 is 0.3%-1%. In the frame-sharing state, the range of the ratio of the 45° side-visual-angle brightness of the part of the displaying device that is located within the entertainment region A3 to the direct-visual-angle brightness of the part of the displaying device that is located within the entertainment region A3 is 7%-12%.

As an example, in the frame-peeping-prevention state, the ratio of the 45° side-visual-angle brightness of the part of the displaying device that is located within the entertainment region A3 to the direct-visual-angle brightness of the part of the displaying device that is located within the entertainment region A3 is 0.3%, 0.5%, 0.8% or 1%.

As an example, in the frame-sharing state, the ratio of the 45° side-visual-angle brightness of the part of the displaying device that is located within the entertainment region A3 to the direct-visual-angle brightness of the part of the displaying device that is located within the entertainment region A3 is 8%, 9%, 10% or 11%.

The displaying device according to the embodiments of the present application provides the user a solution of multiple application scenes, for example, the touch-controlling function, region-division controlling over the brightness of the backlight source, the function of automatic light regulation using an optical sensor in combination with the region-division controlling over the backlight source, the function of peeping prevention, the function of monitoring on an under-screen camera, and the tactile-feeding-back function. As shown in FIG. 14, the function division is performed to the whole touch-controlled large screen. The left ⅓ region is used for providing the instrument. The under-screen camera is placed at the center position of the instrument-provision region, to, in combination with the DMS function, realize the function of monitoring the main driving behavior, thereby improving the travelling safety. The middle ⅓ region is used as the center control, and this region is provided with the functions of touch controlling and tactile feeding-back, to provide the user an excellent experience of human-machine interaction. The right ⅓ region is used as the copilot entertainment region, where, according to user demands, the function of peeping prevention is started up or shut down and the size of the peeping-prevention region is regulated. At the edge of the upper side of the center-control region, the light sensing sensor is integrated, and may automatically regulate the brightness of the entire backlight module according to the brightness of the ambient light. The backlight module employs mini LED lamp boards DB, and, by using the function of region-division controlling, increases the contrast of the entire displaying device, to improve the visual experience of the user.

An embodiment of the present application provides a driving method of a displaying device, wherein the method is applied for the displaying device stated above. As shown in FIG. 17, the method comprises:

- S11: by the electric-power supplying device, providing a first voltage signal PW1 to the first power-supply interface JK1.
- S12: as shown in FIG. 3, by the first power-supply interface JK1, providing the first voltage signal PW1 simultaneously to the first voltage converting circuits Buck1 of the main circuit board M PCBA and the secondary circuit board S PCBA.

In an exemplary embodiment, the first power-supply interface JK1 is electrically connected to both of the first electric-power supplying module Display P of the main circuit board M PCBA and the first electric-power supplying module Display P of the secondary circuit board S PCBA, so as to provide the same power-supply signal simultaneously to the two first electric-power supplying modules Display P.

- S13: by the first voltage converting circuits Buck1, providing a second voltage signal PW2 to the power-supply managing chips PMIC, by the first voltage converting circuits Buck1, providing a third voltage signal PW3 to the second voltage converting circuits Buck2, and, by the first voltage converting circuits Buck1, providing a fourth voltage signal PW4 to the third voltage converting circuits Buck3.
- S14: by the second voltage converting circuits Buck2, providing a fifth voltage signal PW5 to the first driving chips Q1.
- S15: by the third voltage converting circuits Buck3, providing a sixth voltage signal PW6 to the first driving chips Q1, and providing a seventh voltage signal PW7 and an eighth voltage signal PW8 to the time schedule controllers TCON.

The voltage of the fifth voltage signal PW5 and the voltage of the sixth voltage signal PW6 are unequal, and the voltage of the seventh voltage signal PW7 and the voltage of the eighth voltage signal PW8 are unequal.

In an exemplary embodiment, the first power-supply interface JK1 is electrically connected to both of the first electric-power supplying module Display P of the main circuit board M PCBA and the first electric-power supplying module Display P of the secondary circuit board S PCBA, so as to provide the same power-supply signal simultaneously to the two first electric-power supplying modules Display P.

As an example, the first power-supply interface JK1 may be electrically connected to a 12V power-supply adapter, so as to provide a 12V power-supply voltage simultaneously to the two first electric-power supplying modules Display P.

In an exemplary embodiment, the first voltage converting circuit Buck1 may convert the 12V voltage transmitted by the first power-supply interface JK1 into an approximately 5V voltage and subsequently output the voltage. The second voltage converting circuit Buck2 may convert the 5V voltage transmitted by the first voltage converting circuit Buck1 into an approximately 1.25V voltage and subsequently output the voltage to the first driving chips Q1. The third voltage converting circuit Buck3 may convert the 5V voltage transmitted by the first voltage converting circuit Buck1 into an approximately 1.1V voltage and an approximately 1.8V voltage and subsequently output the voltages into the time schedule controller TCON. The third voltage converting circuit Buck3 may further convert the 5V voltage transmitted by the first voltage converting circuit Buck1 into an approximately 3.3V voltage and subsequently output the voltage to the first driving chips Q1.

In the displaying device according to the embodiments of the present application, by configuring that the main circuit board M PCBA and the secondary circuit board S PCBA have the respective electric-power supplying modules, and configuring that, in the same one circuit board, the module for supplying electric power to the backlight module BLU and the module for supplying electric power to the display panel 100 are separate, that can simplify the wiring configuration in the circuit boards and reduce the wire resistance to a large extent, so that the voltages that the first driving chips Q1 acquire from the circuit boards are equal, thereby improving the uniformity and the stability of the signals transmitted in the driving chips Q1 in the displaying device, improving the uniformity of the frame brightness of the displaying device, and improving the effect of displaying.

In at least one embodiment of the present application, as shown in FIG. 18, the method further comprises:

S21: as shown in FIG. 6, at the displaying stage, by the main driving chip M IC, outputting an initial registering signal to the first converting unit Level shifter1 and the second converting unit Level shifter2; and, by the main driving chip M IC, outputting a modulating signal VMD and an enabling signal TP-EN to a converting unit;

S22: by the converting unit SW, under the controlling by the enabling signal TP-EN, being not capable of receiving the modulating signal VMD from the main driving chip M IC; and S23: by the first converting unit Level shifter1, converting the initial registering signal into the shift-registering signal and transmitting to the first shift-register module GOA1; and by the second converting unit Level shifter2, converting the initial registering signal into the shift-registering signal and transmitting to the second shift-register module GOA2.

Figure 19:
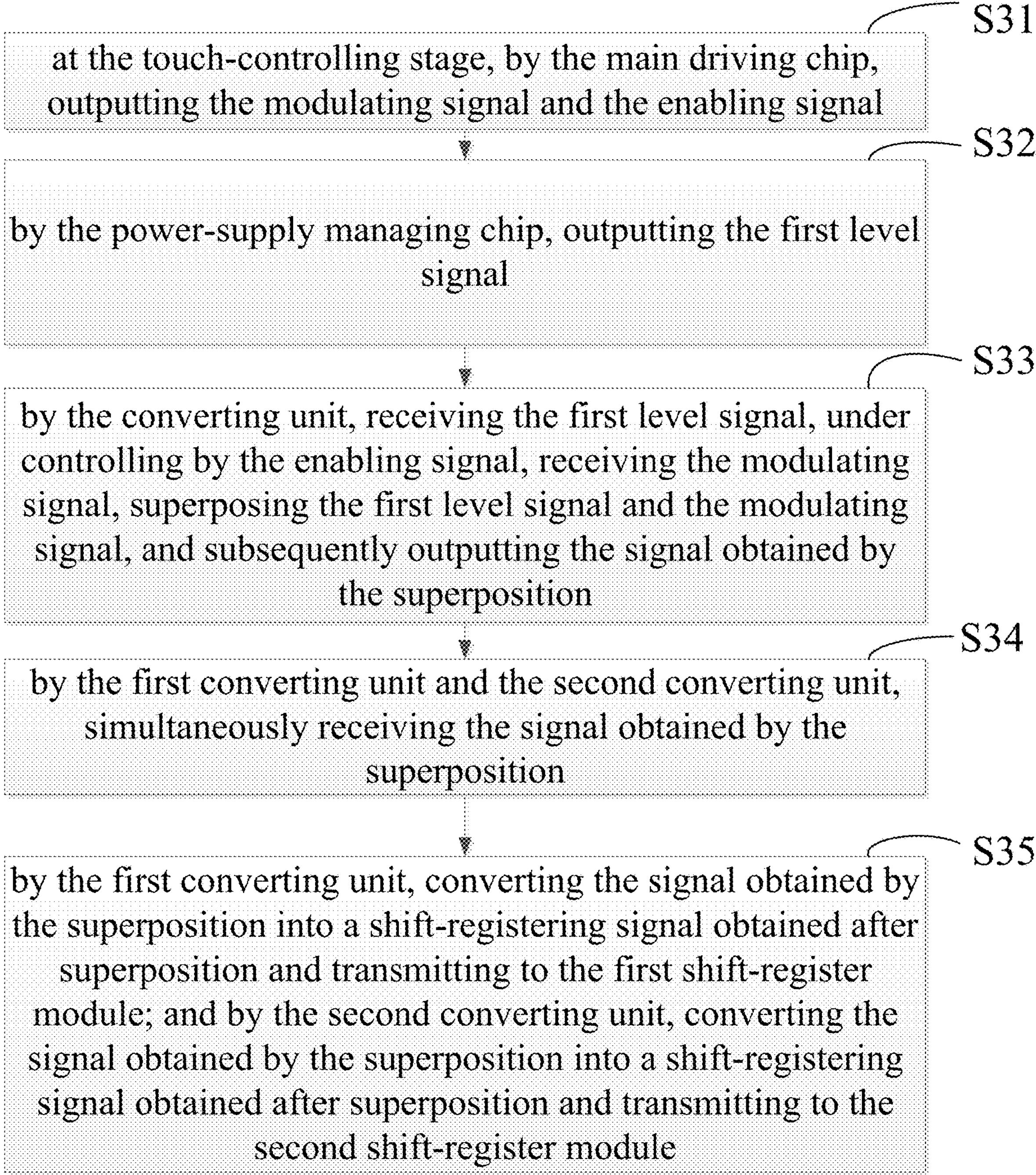

In at least one embodiment of the present application, as shown in FIG. 19, the method further comprises:

S31: at the touch-controlling stage, by the main driving chip M IC, outputting the modulating signal VMD and the enabling signal TP-EN;

S32: by the power-supply managing chip PMIC, outputting the first level signal;

S33: by the converting unit SW, receiving the modulating signal VMD, under the controlling by the enabling signal TP-EN, receiving the first level signal, superposing the first level signal and the modulating signal VMD, and outputting the signal obtained by the superposition;

S34: by the first converting unit Level shifter1 and the second converting unit Level shifter2, simultaneously receiving the signal obtained by the superposition; and S35: by the first converting unit Level shifter1, converting the signal obtained by the superposition into a shift-registering signal obtained after superposition and transmitting to the first shift-register module GOA1; and by the second converting unit Level shifter2, converting the signal obtained by the superposition into a shift-registering signal obtained after superposition and transmitting to the second shift-register module GOA2.

As an example, the first level signal may include two signals VGH-P and VGL-P. Taking the case as an example in which the signal outputted by the converting module SW is VGL-S, at the displaying stage, the enabling signal TP-EN outputted by the main driving chip M IC is a low level, and the converting module SW, under the controlling by the enabling signal TP-EN, is not capable of receiving the modulating signal VMD from the main driving chip M IC, in which case VGL-S=VGL-P. At the touch-controlling stage, the enabling signal TP-EN outputted by the main driving chip M IC is a high level, and the converting module SW, under the controlling by the enabling signal TP-EN, is capable of receiving the modulating signal VMD from the main driving chip M IC, in which case, by the effect of the converting module SW, the signal outputted by the converting module SW is superposed with the modulating signal VMD, to cause that VGL-S=VGL-P+VMD.

In the driving method of a displaying device according to the embodiments of the present application, at the touch-controlling stage, the first converting unit Level shifter1 and the second converting unit Level shifter2, by using the signal obtained by the superposition of the received first level signal and modulating signal as the reference signal, generate the shift-registering signal and transmit the shift-registering signal into the first shift-register module GOA1 and the second shift-register module GOA2. At this point, the shift-registering signal carries the modulating signal, and, as the shift-register modules are electrically connected to the grid lines, the signals outputted by the shift-register modules into the grid lines also carry the modulating signal. That, at the touch-controlling stage, reduces the parasitic capacitance between the touch-controlling electrodes and the grid lines, thereby preventing interference by the parasitic capacitance to the signals in the touch-controlling electrodes, and improving the touch-controlling sensitivity of the displaying device.

In at least one embodiment of the present application, as shown in FIG. 20, the method further comprises:

S41: at the touch-controlling stage, by all of the first driving chips Q1, receiving the touch-controlling signal from the display panel, wherein all of the first driving chips Q1 include one main driving chip M IC and the secondary driving chips S IC besides the main driving chip;

S42: by the secondary driving chips S IC, transmitting the touch-controlling signal from the display panel 100 to the main driving chip M IC; and S43: by the main driving chip M IC, transmitting the touch-controlling signal to the system chip SOC.

In the driving method of a displaying device according to the embodiments of the present application, after the main driving chip M IC has received the touch-controlling information, the main driving chip M IC transmits the touch-controlling information into the system chip SOC via the traces in the main circuit board M PCBA. After any one of the secondary driving chips S IC has received the touch-controlling information, because all of the first driving chips Q1 are cascaded (for example, cascaded by the third connectors Connecter3), that secondary driving chip S IC transmits the received touch-controlling information to the main driving chip M IC, and the main driving chip M IC transmits the touch-controlling information into the system chip SOC via the traces in the main circuit board M PCBA. Subsequently the system chip SOC, according to the collected touch-controlling signal, by using the user interface, realizes a good human-machine interaction.

In at least one embodiment of the present application, as shown in FIG. 21, the method further comprises:

S51: in the frame-sharing state, by the system chip SOC, transmitting the white-frame image signal into the visual-angle controlling panel 200; and S52: in the frame-peeping-prevention state, by the system chip SOC, transmitting the white-frame image signal into all of the second pixel units, and transmitting the black-frame image signal into at least some of the first pixel units.

In the driving method of a displaying device according to the embodiments of the present application, all of the second pixel units transmit the white-frame image signal, some of the first pixel units transmit the white-frame image signal, and some of the first pixel units transmit the black-frame image signal. Accordingly, the light rays exiting the region where the pixel units transmitting the white-frame image signal are located in the visual-angle controlling panel 200 are non-collimated light rays, so that the displaying light rays exiting the displaying device can exit in the directions of the direct visual angle and the side visual angles, to realize the frame sharing of a local region. The light rays exiting the region where the pixel units transmitting the black-frame image signal are located in the visual-angle controlling panel 200 are collimated light rays, so that the displaying light rays exiting the displaying device can exit in the direction of the direct visual angle, to realize the frame peeping prevention of a local region. Accordingly, the pixel-level switching between the frame peeping prevention and the frame sharing in the displaying device can be realized.

An embodiment of the present application provides a travelling tool, wherein the travelling tool comprises the displaying device stated above, and the displaying device is located between two A-pillars of the travelling tool.

The particular structure of the displaying device comprised by the travelling tool may refer to the above description, and is not discussed further herein.

As an example, the travelling tool may include a car, a high-speed railway train, a train and so on.

The above are merely particular embodiments of the present application, and the protection scope of the present application is not limited thereto. All of the variations or substitutions that a person skilled in the art can easily envisage within the technical scope disclosed by the present application should fall within the protection scope of the present application. Therefore, the protection scope of the present application should be subject to the protection scope of the claims.

The invention claimed is:

1. A displaying device, wherein the displaying device comprises:

a backlight module, wherein the backlight module comprises at least one lamp board;

a display panel located on one side of the backlight module;

at least two first driving-chip groups, wherein each of the first driving-chip groups comprises at least two first driving chips, and all of the first driving chips are electrically connected to the display panel;

at least two first circuit boards, wherein each of the first circuit boards is electrically connected to one instance of the first driving-chip groups, the first circuit boards are cascaded to each other, and at least some of signals transmitted in the first circuit boards are synchronous; and the first circuit boards are electrically connected to the backlight module; and a system chip, electrically connected to the first circuit boards, and configured for providing at least two channels of a same video signal to the at least two first circuit boards, and receiving a touch-controlling signal from the display panel, wherein:

the displaying device comprises two instances of the first circuit boards;

the two first circuit boards include a main circuit board and a secondary circuit board, the main circuit board further comprises a first electric-power supplying module, a second electric-power supplying module and a first connector, the secondary circuit board further comprises the first electric-power supplying module, the second electric-power supplying module and the first connector, the first electric-power supplying module is electrically connected to the display panel, the second electric-power supplying module is electrically connected to the backlight module, and the first connector is electrically connected to the system chip;

the main circuit board comprises a first power-supply interface, the first power-supply interface is electrically connected to the first electric-power supplying module and an electric-power supplying device, and the first power-supply interface is configured for supplying electric power simultaneously to the first electric-power supplying modules of the main circuit board and the secondary circuit board; and each of the main circuit board and the secondary circuit board comprises a second power-supply interface, the second power-supply interface is electrically connected to the second electric-power supplying module and the electric-power supplying device, and the second power-supply interface is configured for supplying electric power to the second electric-power supplying module.

2. The displaying device according to claim 1, wherein the displaying device comprises two instances of the first driving-chip groups;

each of the first driving-chip groups comprises eight instances of the first driving chips, each of the first circuit boards comprises a time schedule controller, and signals of the two time schedule controllers are synchronous with each other;

each of the time schedule controllers is electrically connected to the first driving chips in one instance of the first driving-chip groups; and the time schedule controllers are configured for performing type conversion to the video signal, and transmitting the video signals obtained by the conversion to the first driving chips.

3. The displaying device according to claim 1, wherein each of the first electric-power supplying module of the main circuit board and the first electric-power supplying module of the secondary circuit board comprises a first voltage converting circuit, a second voltage converting circuit, a third voltage converting circuit and a power-supply managing chip; and the first power-supply interface is electrically connected to the first voltage converting circuit, the first voltage converting circuit is electrically connected to the power-supply managing chip, the second voltage converting circuit and the third voltage converting circuit, the second voltage converting circuit is electrically connected to the first driving chips, and the third voltage converting circuit is electrically connected to the time schedule controller and the first driving chips;

wherein the second electric-power supplying module comprises a second connector and two fourth voltage converting circuits;

the second connector is electrically connected to the lamp board, and each of the fourth voltage converting circuits is electrically connected to the second power-supply interface and the second connector;

the backlight module comprises two instances of the lamp board; and the two fourth voltage converting circuits in a same one instance of the second electric-power supplying module are configured for supplying electric power to a same one instance of the lamp boards;

wherein the displaying device further comprises at least two third connectors, each of the third connectors is electrically connected to the main circuit board and the secondary circuit board, the first electric-power supplying module of the secondary circuit board is electrically connected to the first power-supply interface by the third connector, and the time schedule controller of the main circuit board and the time schedule controller of the secondary circuit board are electrically connected by the third connector.

4. The displaying device according to claim 3, wherein the lamp boards are electrically connected to the second connector, and each of the two lamp boards comprises:

a base board;

a plurality of light regions that are located on one side of the base board and are arranged in an array, wherein each of the light regions contains at least one light emitting device; and a plurality of minisized chips located on one side of the base board that is farther from the light emitting device, wherein each of the minisized chips is electrically connected to the light emitting device within one instance of the light regions; and all of the minisized chips in a same one instance of the lamp boards are electrically connected to a same one instance of the time schedule controllers, and the time schedule controller is configured for, by using the minisized chips, controlling the light regions of the lamp board to emit light in a region-division mode.

5. The displaying device according to claim 4, wherein all of the first driving chips include one main driving chip and secondary driving chips besides the main driving chip, the main driving chip is electrically connected to the main circuit board, and all of the first driving chips are cascaded; and each of the secondary driving chips is configured for transmitting the touch-controlling signal from the display panel to the main driving chip, and the main driving chip is configured for transmitting the touch-controlling signal to the system chip;

wherein the display panel comprises a first shift-register module and a second shift-register module that are located on two sides of a displaying region; and the main driving chip is configured for controlling to transmit a shift-registering signal to the first shift-register module and the second shift-register module.

6. The displaying device according to claim 5, wherein the main circuit board comprises a first converting unit, the secondary circuit board comprises a second converting unit, the first converting unit is electrically connected to the main driving chip and the first shift-register module, and the second converting unit is electrically connected to the main driving chip and the second shift-register module; and the first converting unit and the second converting unit are configured for, under controlling by the main driving chip, generating the shift-registering signal.

7. The displaying device according to claim 6, wherein a minimum distance between the first converting unit and the first shift-register module and a minimum distance between the second converting unit and the second shift-register module are substantially equal; or wherein the main circuit board further comprises a converting module, and the converting module is electrically connected to the main driving chip and the power-supply managing chip of the main circuit board;

the converting module is electrically connected to the first converting unit and the second converting unit;

the main driving chip is configured for controlling the converting module to be switched between a displaying stage and a touch-controlling stage;

at the touch-controlling stage, the converting module is configured for being capable of receiving a modulating signal transmitted by the main driving chip and a first level signal transmitted by the power-supply managing chip, superposing the first level signal and the modulating signal, and subsequently outputting to the first converting unit and the second converting unit; and at the displaying stage, the converting module is configured for being capable of receiving the first level signal transmitted by the power-supply managing chip, and transmitting the outputted signal to the first converting unit and the second converting unit.

8. The displaying device according to claim 7, wherein the display panel comprises a light sensing sensor, and the displaying device further comprises a light-sensation processor;

the light sensing sensor is electrically connected to the light-sensation processor by the first circuit boards;

the light-sensation processor is electrically connected to the time schedule controllers;

the light sensing sensor is configured for converting a collected optical signal into an electric signal and transmitting to the light-sensation processor;

the light-sensation processor receives the electric signal, performs signal processing to the electric signal, and subsequently outputs a light regulating signal to the time schedule controllers; and the time schedule controllers generate controlling signals according to the light regulating signal and transmit the controlling signals to the minisized chips.

9. The displaying device according to claim 8, wherein the displaying device further comprises a visual-angle controlling panel and a privacy film, and the visual-angle controlling panel is located between the backlight module and the display panel;

the privacy film covers at least part of a region of a light-exiting face of the backlight module; and the displaying device further comprises at least two second driving-chip groups and at least two second circuit boards, each of the second driving-chip groups comprises at least one second driving chip, all of the second driving chips are electrically connected to the visual-angle controlling panel, each of the second driving-chip groups is electrically connected to one instance of the second circuit boards, the second circuit boards are cascaded to each other, one instance of the second circuit boards is electrically connected to the system chip, and the system chip is configured for transmitting an image signal to the second circuit board.

10. The displaying device according to claim 9, wherein the displaying device further comprises a camera, the backlight module is provided with a mounting hole, and the camera is provided in the mounting hole;

each of the display panel and the visual-angle controlling panel is provided with a light transmitting region, and orthographic projections of the light transmitting regions on the camera cover the camera; and the displaying device further comprises a controlling board, and the controlling board is electrically connected to the camera and the system chip; or wherein a resolution of the visual-angle controlling panel is ⅙-½ of a resolution of the display panel.

11. The displaying device according to claim 6, wherein the system chip comprises a hand-gesture identifying module, and the hand-gesture identifying module is electrically connected to the controlling board;

the camera is configured for collecting hand-gesture-action information of a driving person, and transmitting the hand-gesture-action information to the controlling board, and the controlling board is configured for receiving the hand-gesture-action information and feeding back the hand-gesture-action information into the hand-gesture identifying module; and the hand-gesture identifying module is configured for storing a predetermined relation between the hand-gesture-action information and an instruction signal, determining the instruction signal according to the hand-gesture-action information, and according to the instruction signal, controlling the display panel to execute a corresponding operation.

12. The displaying device according to claim 10, wherein the system chip comprises a driving-person monitoring module, and the driving-person monitoring module is electrically connected to the controlling board;

the camera is configured for monitoring a driving behavior of a driving person, and transmitting driving-behavior information to the controlling board;

the controlling board is configured for receiving the driving-behavior information and feeding back the driving-behavior information to the driving-person monitoring module; and the driving-person monitoring module is configured for receiving the driving-behavior information and, according to the driving-behavior information, transmitting a video signal having a prompting message to the display panel; or wherein the display panel comprises a touch-controlling layer, the touch-controlling layer comprises a plurality of touch-controlling electrodes and a hollowed-out part, orthographic projections of the touch-controlling electrodes on a substrate of the display panel are within a region outside the light transmitting region, and an orthographic projection of the hollowed-out part on the substrate of the display panel is within the light transmitting region; or wherein the displaying device comprises an instrument-provision region, a center-control region and an entertainment region, and the center-control region is located between the instrument-provision region and the entertainment region;

the privacy film is provided within the entertainment region; and in a frame-sharing state, the time schedule controllers are configured for controlling brightnesses of a part of the light emitting devices that are located within the entertainment region to be greater than brightnesses of a part of the light emitting devices that are located within the instrument-provision region and the center-control region, and brightnesses of the instrument-provision region, the center-control region and the entertainment region of the displaying device to be equal;

wherein the image signal comprises a white-frame image signal and a black-frame image signal; and in the frame-sharing state, the system chip is configured for transmitting the white-frame image signal into the visual-angle controlling panel;

wherein the visual-angle controlling panel comprises a plurality of first pixel units and a plurality of second pixel units besides the first pixel units, an orthographic projection of the privacy film on the visual-angle controlling panel covers the first pixel units, and the plurality of first pixel units are located within the entertainment region; and in a frame-peeping-prevention state, the system chip is configured for transmitting the white-frame image signal into all of the second pixel units, and transmitting the black-frame image signal into at least some of the first pixel units.

13. The displaying device according to claim 12, wherein the touch-controlling electrodes include a plurality of first touch-controlling electrodes and a plurality of second touch-controlling electrodes, the plurality of first touch-controlling electrodes surround the hollowed-out part, a minimum distance between the first touch-controlling electrodes and an edge of the hollowed-out part is less than a planar dimension of each of the second touch-controlling electrodes, and an area of a planar pattern of each of the first touch-controlling electrodes is 107%-110% of an area of a planar pattern of each of the second touch-controlling electrodes.

14. The displaying device according to claim 12, wherein the displaying device comprises two instances of the second driving-chip groups and two instances of the second circuit boards, a first instance of the second driving-chip groups comprises two instances of the second driving chip, and a second instance of the second driving-chip groups comprises one instance of the second driving chip;

the second instance of the driving-chip groups is electrically connected to a part of the visual-angle controlling panel that is located within the entertainment region; and in the frame-peeping-prevention state, the system chip is configured for, by using the second instance of the driving-chip groups, transmitting the black-frame image signal to the part of the visual-angle controlling panel that is located within the entertainment region; or wherein the displaying device comprises a cover plate, the cover plate covers the display panel, and a planar size of the cover plate is greater than a planar size of the display panel;

a part of the cover plate that is located within the center-control region is provided with at least two exciters, the two exciters are located on one side of the cover plate that is closer to the backlight module, and the two exciters are located on two opposite lateral sides of the cover plate; and the exciters are electrically connected to the display panel, and the exciters are configured for vibrating after the display panel has received a touch-controlling operation, wherein the touch-controlling operation includes sliding and pressing.

15. The displaying device according to claim 14, wherein the cover plate comprises a first region and a second region besides the first region, and an orthographic projection of the camera on the cover plate is within the first region; and the cover plate comprises a first surface, the first surface is closer to the display panel, a first printing-ink layer is provided at a part of the first surface that is located within the first region, a second printing-ink layer is provided at a part of the first surface that is located within the second region, the first printing-ink layer is configured for being capable of transmitting displaying light rays of the display panel, and the second printing-ink layer is configured for being capable of transmitting infrared light rays.

16. A driving method of a displaying device, wherein the method is applied for the displaying device according to claim 12, and the method comprises:

by the electric-power supplying device, providing a first voltage signal to the first power-supply interface;

by the first power-supply interface, providing the first voltage signal simultaneously to the first voltage converting circuits of the main circuit board and the secondary circuit board;

by the first voltage converting circuits, providing a second voltage signal to the power-supply managing chips, providing a third voltage signal to the second voltage converting circuits, and providing a fourth voltage signal to the third voltage converting circuits;

by the second voltage converting circuits, providing a fifth voltage signal to the first driving chips; and by the third voltage converting circuits, providing a sixth voltage signal to the first driving chips, and providing a seventh voltage signal and an eighth voltage signal to the time schedule controllers;

wherein a voltage of the fifth voltage signal and a voltage of the sixth voltage signal are unequal, and a voltage of the seventh voltage signal and a voltage of the eighth voltage signal are unequal.

17. The driving method according to claim 16, wherein the method further comprises:

at the displaying stage, by the main driving chip, outputting an initial registering signal to the first converting unit and the second converting unit; and, by the main driving chip, outputting a modulating signal and an enabling signal to a converting unit;

by the converting unit, under controlling by the enabling signal, being not capable of receiving the modulating signal from the main driving chip;

by the first converting unit, converting the initial registering signal into the shift-registering signal and transmitting to the first shift-register module; and by the second converting unit, converting the initial registering signal into the shift-registering signal and transmitting to the second shift-register module; or wherein the method further comprises:

in the frame-sharing state, by the system chip, transmitting the white-frame image signal into the visual-angle controlling panel; and in the frame-peeping-prevention state, by the system chip, transmitting the white-frame image signal into all of the second pixel units, and transmitting the black-frame image signal into at least some of the first pixel units.

18. The driving method according to claim 17, wherein the method further comprises:

at the touch-controlling stage, by the main driving chip, outputting the modulating signal and the enabling signal;

by the power-supply managing chip, outputting the first level signal;

by the converting unit, receiving the first level signal, under controlling by the enabling signal, receiving the modulating signal, superposing the first level signal and the modulating signal, and subsequently outputting the signal obtained by the superposition;

by the first converting unit and the second converting unit, simultaneously receiving the signal obtained by the superposition;

by the first converting unit, converting the signal obtained by the superposition into a shift-registering signal obtained after superposition and transmitting to the first shift-register module; and by the second converting unit, converting the signal obtained by the superposition into a shift-registering signal obtained after superposition and transmitting to the second shift-register module;

wherein the method further comprises:

at the touch-controlling stage, by all of the first driving chips, receiving the touch-controlling signal from the display panel, wherein all of the first driving chips include one instance of the main driving chip and the secondary driving chips besides the main driving chip;

by the secondary driving chips, transmitting the touch-controlling signal from the display panel to the main driving chip; and by the main driving chip, transmitting the touch-controlling signal to the system chip.

19. A travelling tool, wherein the travelling tool comprises the displaying device according to claim 1, and the displaying device is located between two A-pillars of the travelling tool.

* * * * *